(12) United States Patent
Miyoshi et al.

(10) Patent No.: US 8,166,827 B2
(45) Date of Patent: May 1, 2012

(54) MEMS DEVICE AND METHOD FOR MANUFACTURING THE SAME

(75) Inventors: Yuichi Miyoshi, Niigata (JP); Tohru Yamaoka, Osaka (JP); Hidenori Notake, Osaka (JP); Yusuke Takeuchi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 499 days.

(21) Appl. No.: 12/436,374

(22) Filed: May 6, 2009

(65) Prior Publication Data

US 2010/0059836 A1    Mar. 11, 2010

(30) Foreign Application Priority Data

Sep. 10, 2008 (JP) .................................. 2008-232628

(51) Int. Cl.
*G01L 9/06* (2006.01)
(52) U.S. Cl. .................. 73/727; 73/700; 73/715
(58) Field of Classification Search .................. None
See application file for complete search history.

(56) References Cited

U.S. PATENT DOCUMENTS

| | | | |
|---|---|---|---|
| 4,924,131 A * | 5/1990 | Nakayama et al. | ............ 310/329 |
| 5,146,435 A | 9/1992 | Bernstein | |
| 5,569,855 A | 10/1996 | Schomburg et al. | |
| 5,793,073 A | 8/1998 | Kaminishi et al. | |
| 6,455,793 B1 | 9/2002 | Kasahara et al. | |
| 6,675,644 B2 * | 1/2004 | Yamakawa et al. | ........ 73/204.26 |
| 6,898,842 B2 | 5/2005 | Kasahara et al. | |
| 7,000,472 B2 * | 2/2006 | Kinoshita | ................... 73/504.12 |
| 7,373,835 B2 | 5/2008 | Matsubara | |
| 7,377,175 B2 | 5/2008 | Matsubara | |
| 2001/0052266 A1 | 12/2001 | Murata et al. | |
| 2004/0056560 A1 | 3/2004 | Wang et al. | |
| 2009/0074211 A1 | 3/2009 | Hirade et al. | |

FOREIGN PATENT DOCUMENTS

| | | |
|---|---|---|
| DE | 101 26 621 A1 | 12/2001 |
| JP | 60-138434 | 7/1985 |
| JP | 10-073505 | 3/1998 |
| JP | 2008-098524 | 4/2008 |
| WO | WO 99/39170 | 8/1999 |

OTHER PUBLICATIONS

Extended European Search Report issued in European Patent Application No. 07859774.7, dated Sep. 15, 2011.
United States Office Action issued in United States Patent Application No. 12/630,179 dated Sep. 30, 2010.
U.S. Notice of Allowance issued in U.S. Appl. No. 12/630,179, dated Nov. 29, 2011.
United States Office Action issued in U.S. Appl. No. 12/630,179 dated May 10, 2011.

* cited by examiner

*Primary Examiner* — Lisa Caputo
*Assistant Examiner* — Jermaine Jenkins
(74) *Attorney, Agent, or Firm* — McDermott Will & Emery LLP

(57) ABSTRACT

A MEMS device, including: a substrate having a first principal plane and a second principal plane opposite to the first principal plane; a through hole formed in the substrate; and a vibrating film formed over the first principal plane so as to cover the through hole. The first principal plane and the second principal plane are both a (110) crystal face; and the through hole has a substantially rhombic shape on the second principal plane.

32 Claims, 28 Drawing Sheets

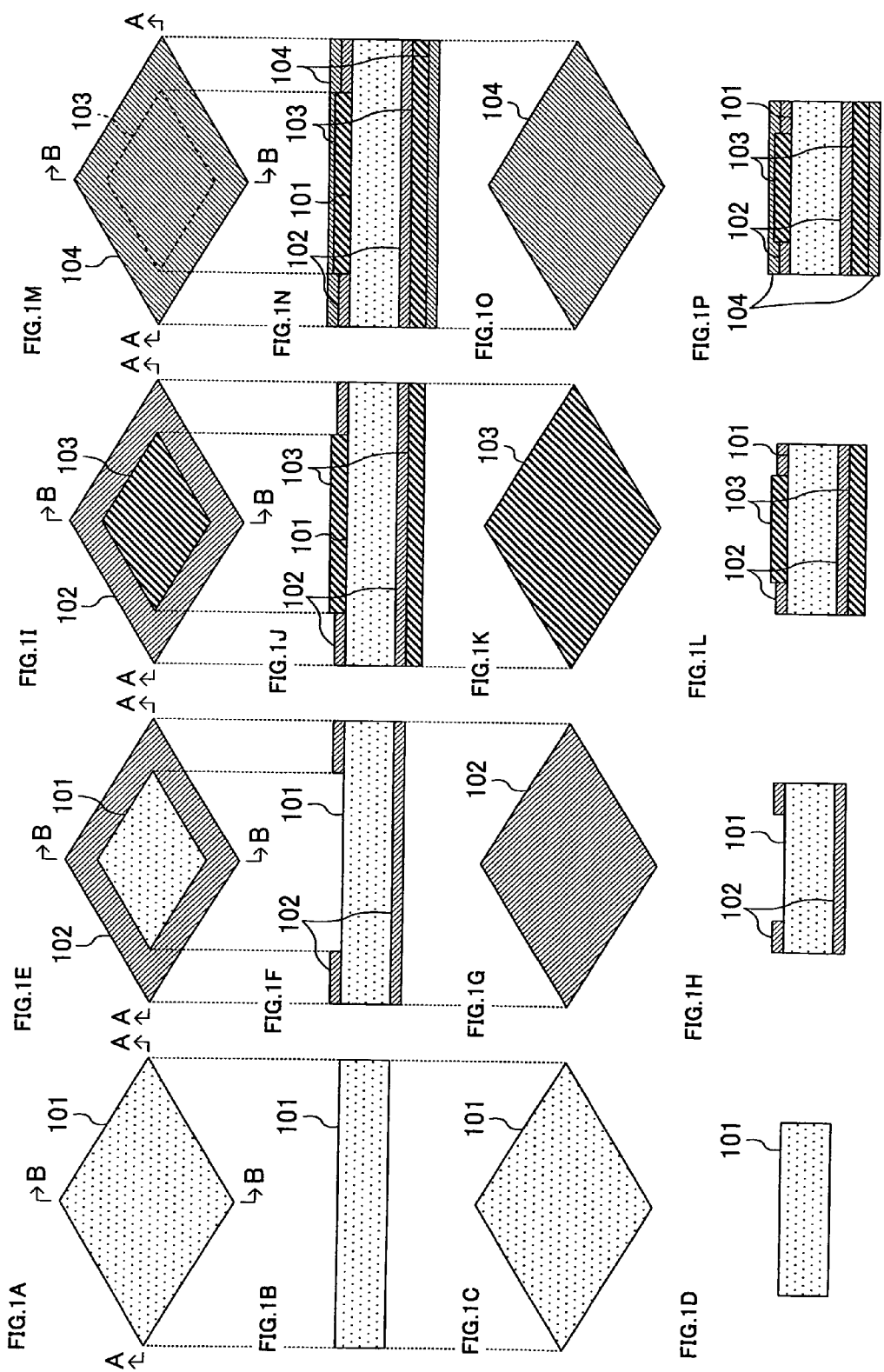

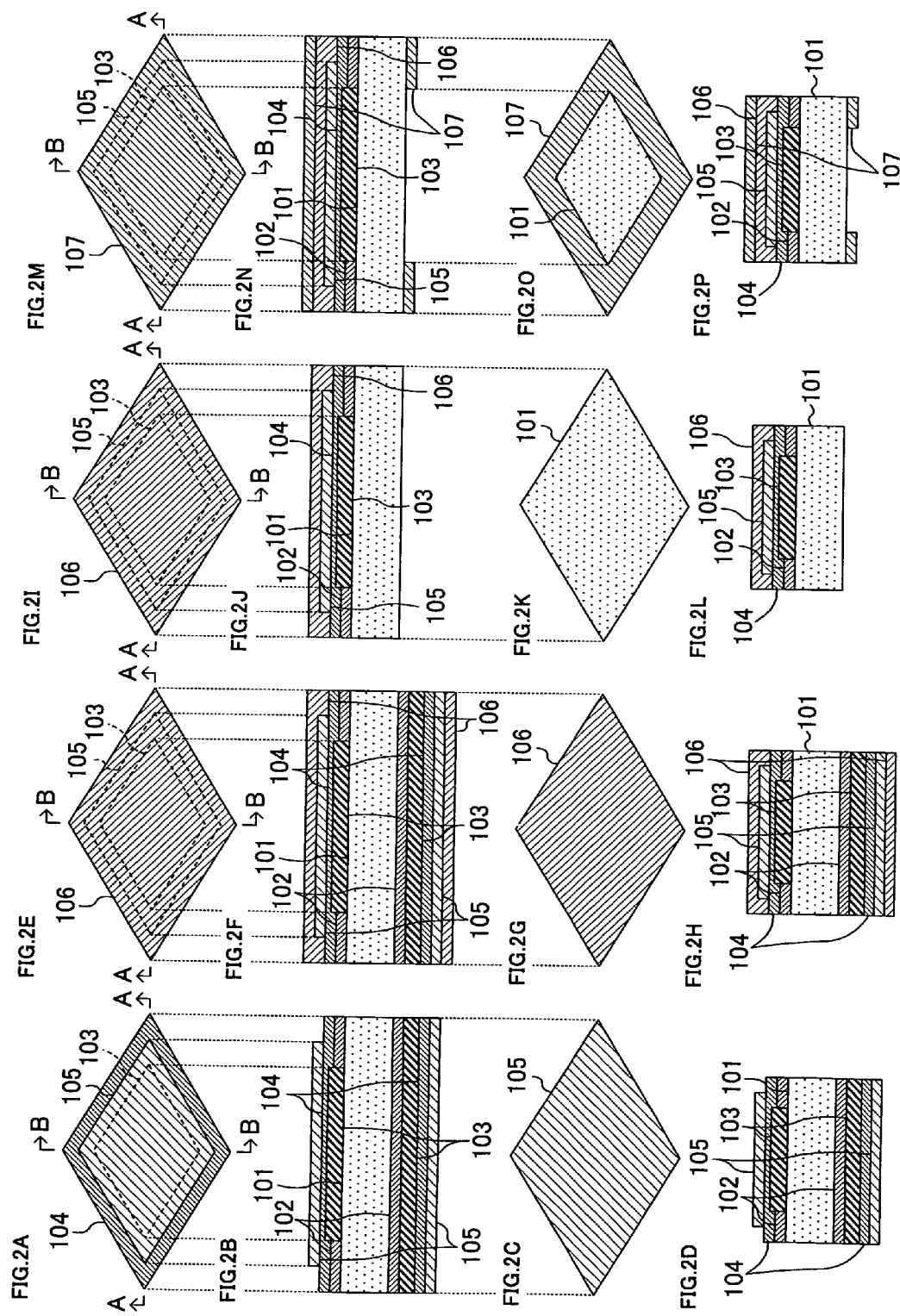

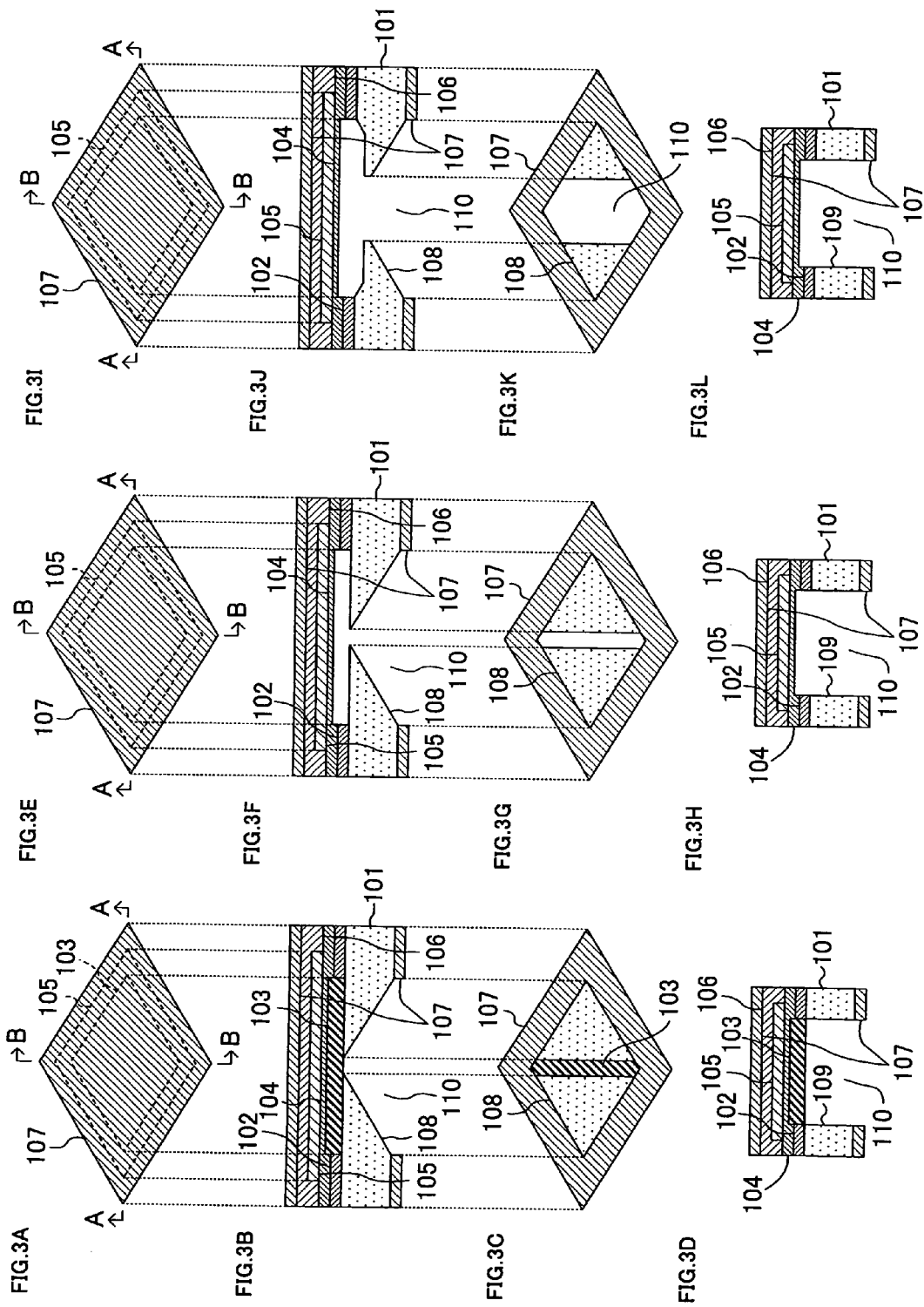

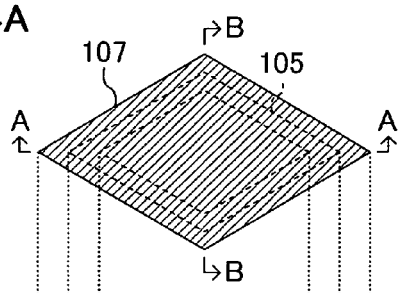
FIG.4A
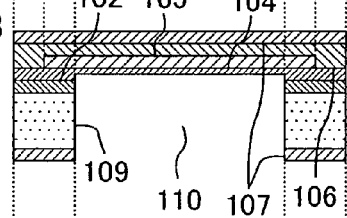
FIG.4B
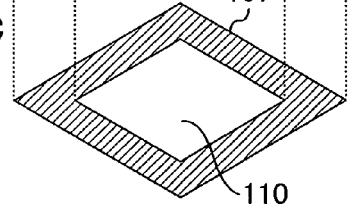
FIG.4C
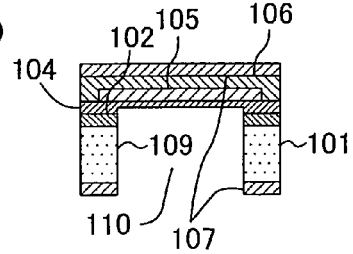
FIG.4D
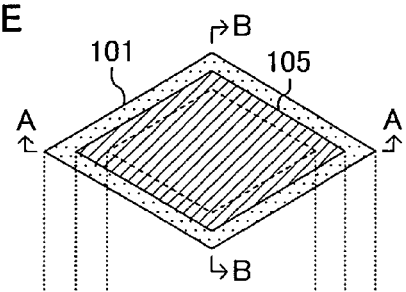
FIG.4E
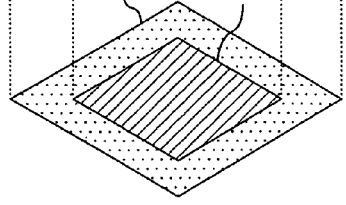
FIG.4F
FIG.4G
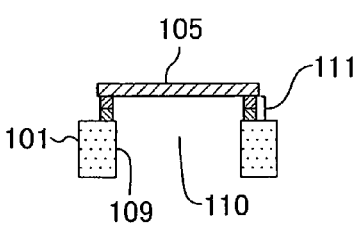
FIG.4H

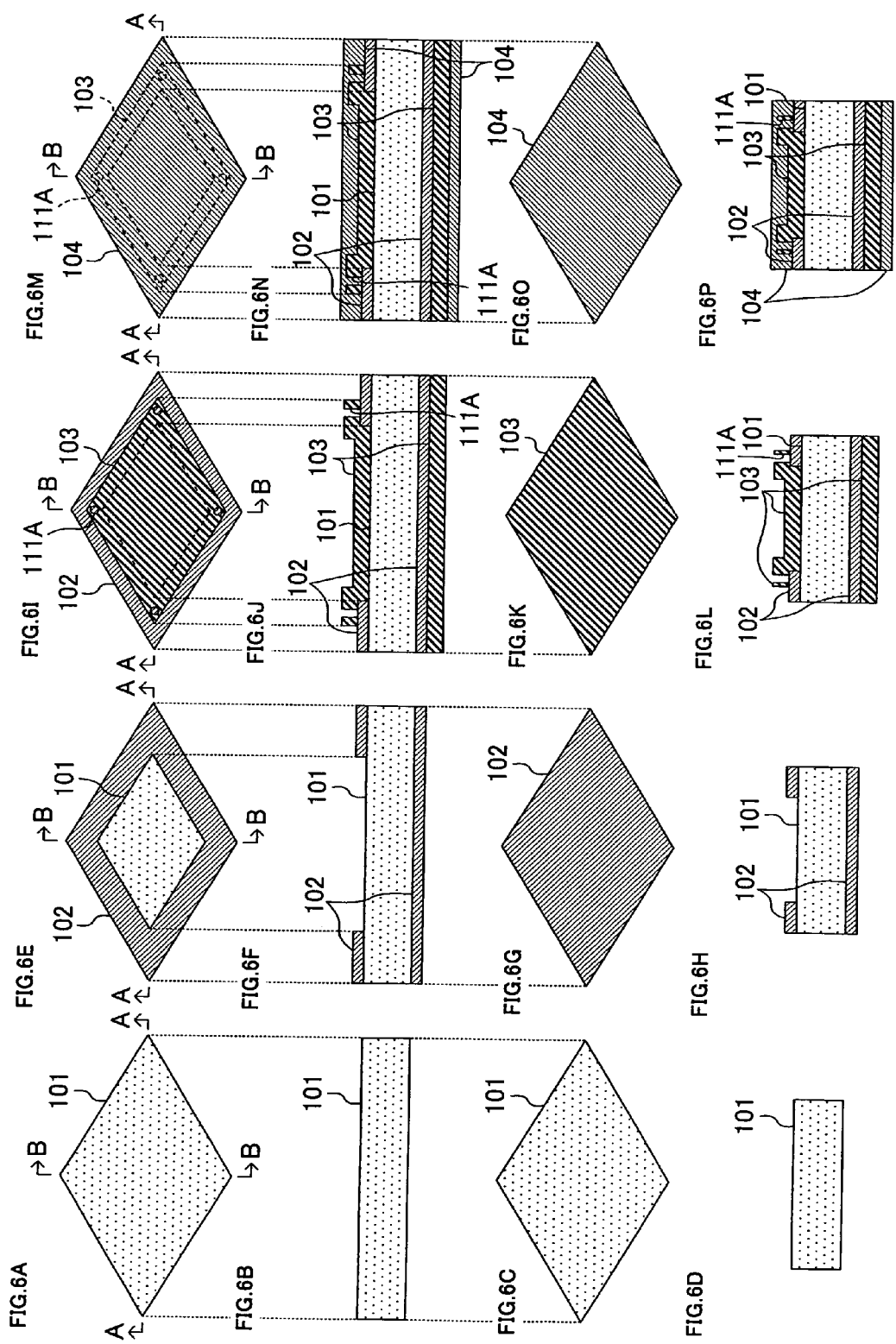

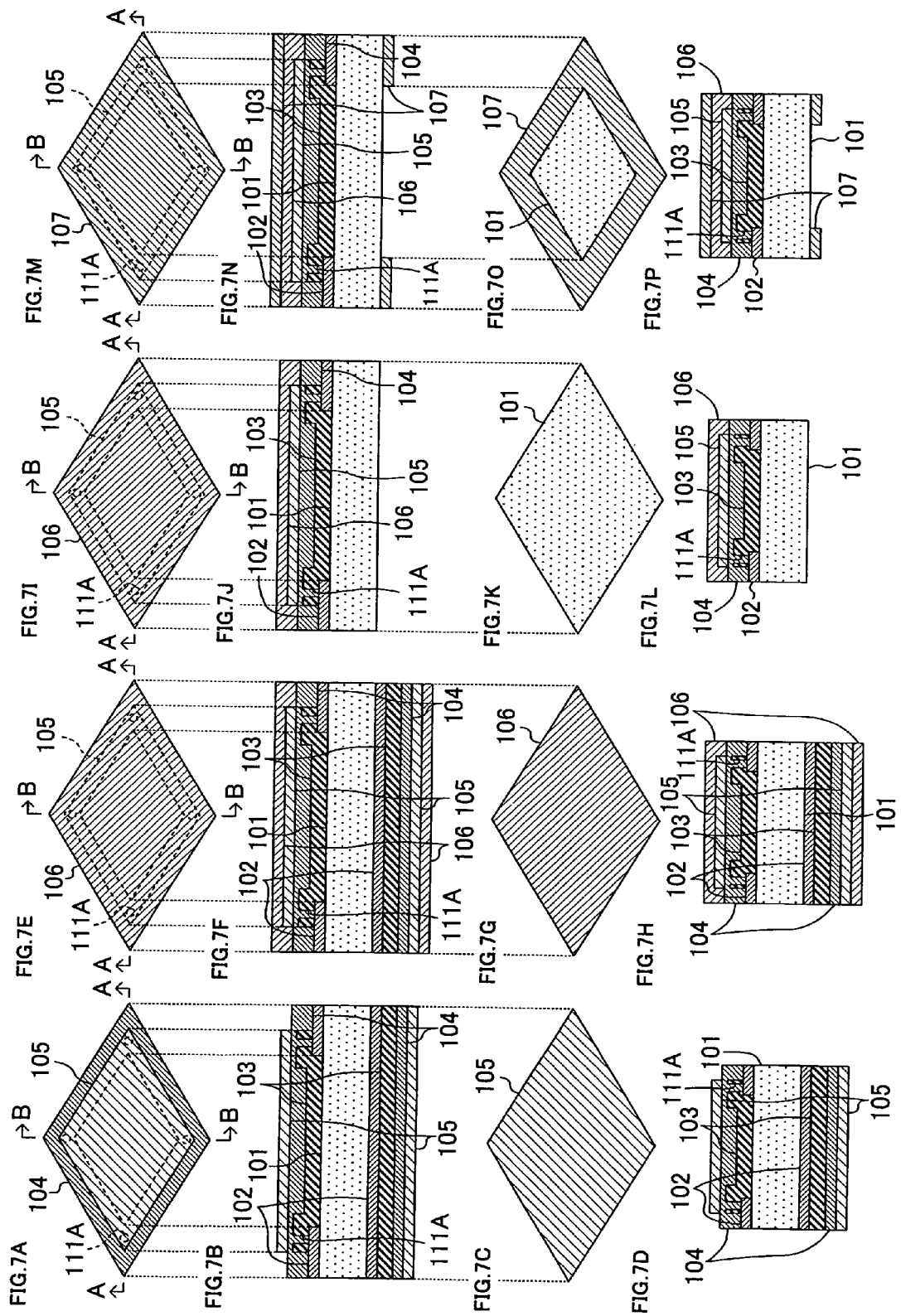

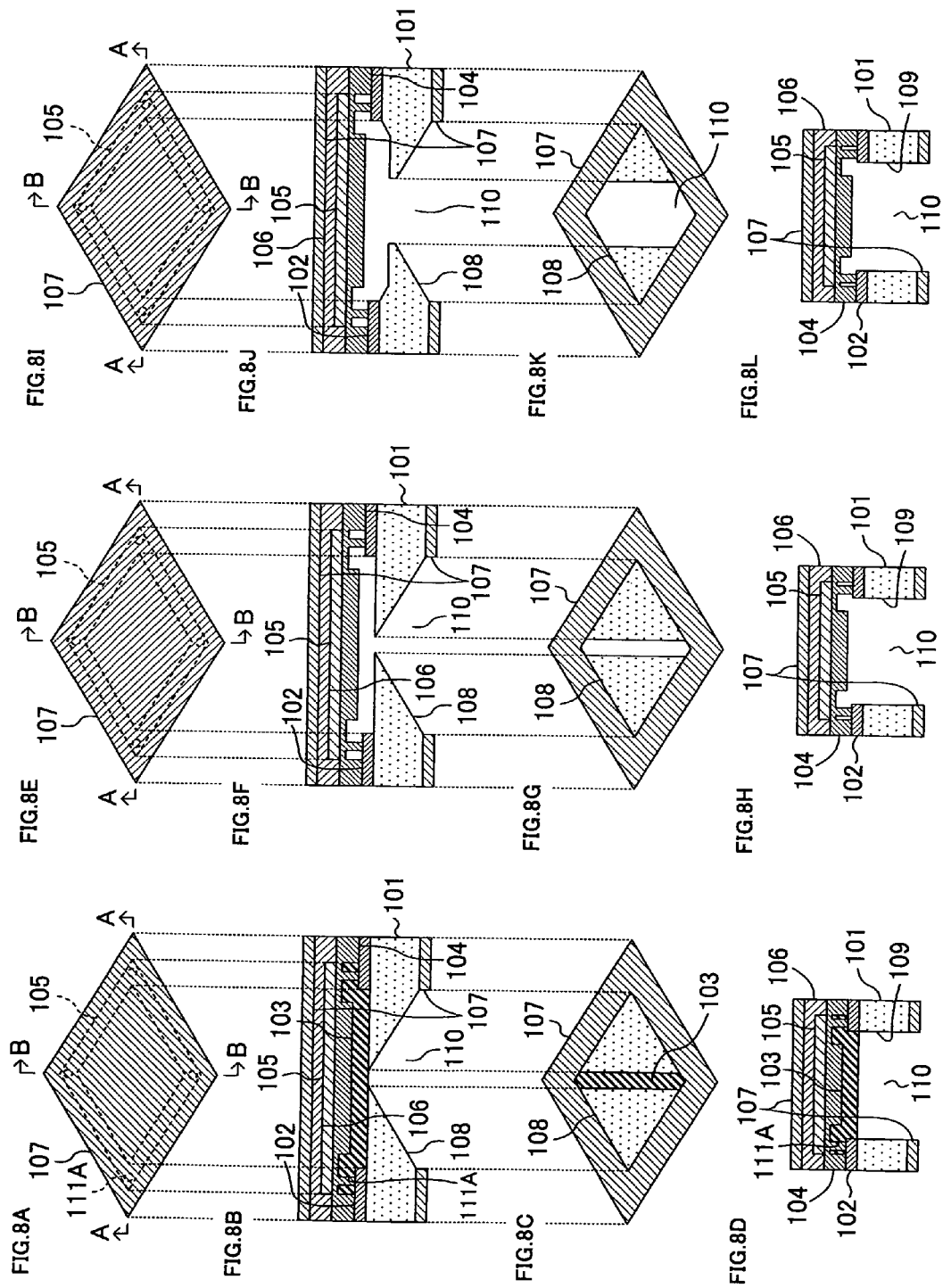

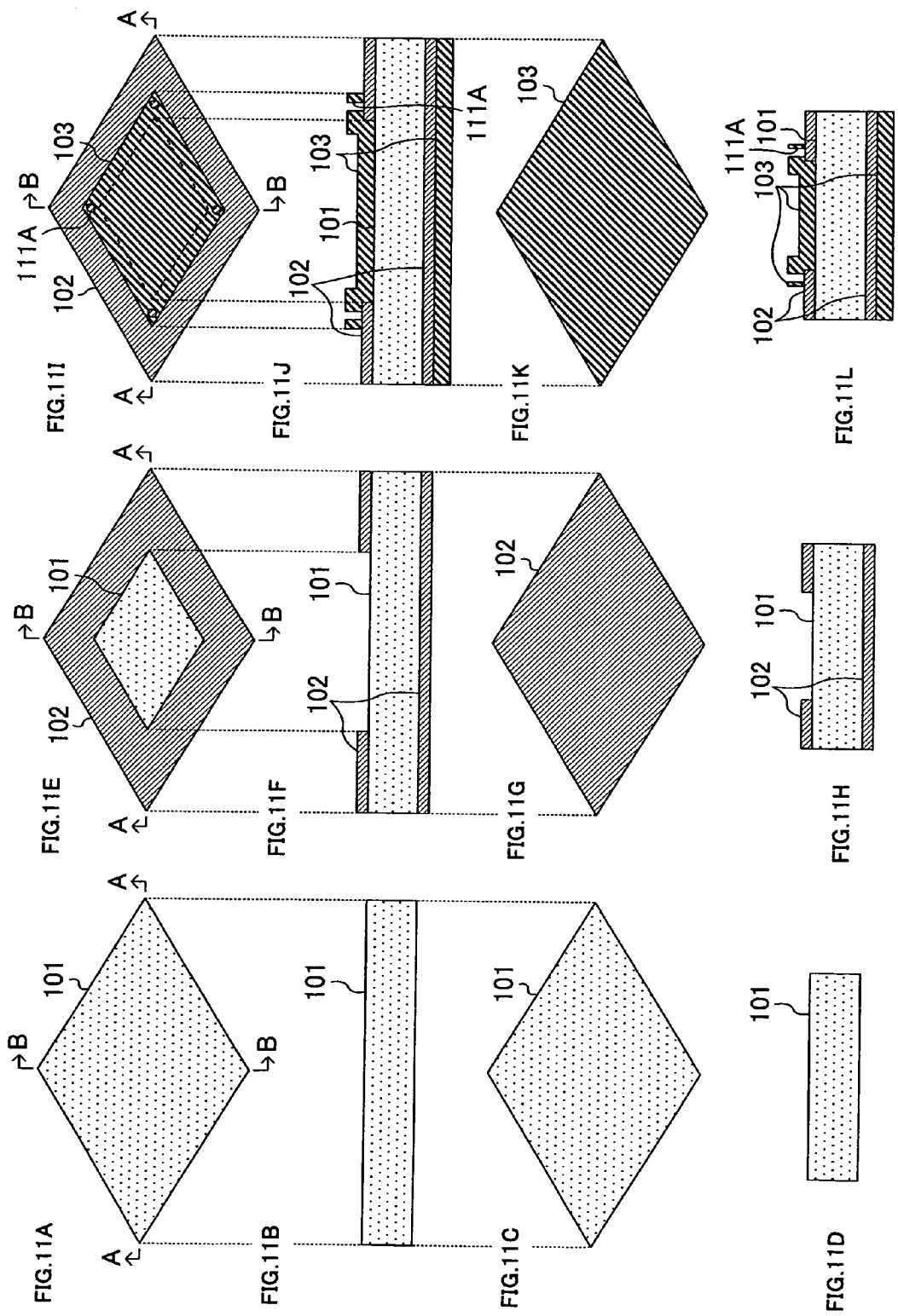

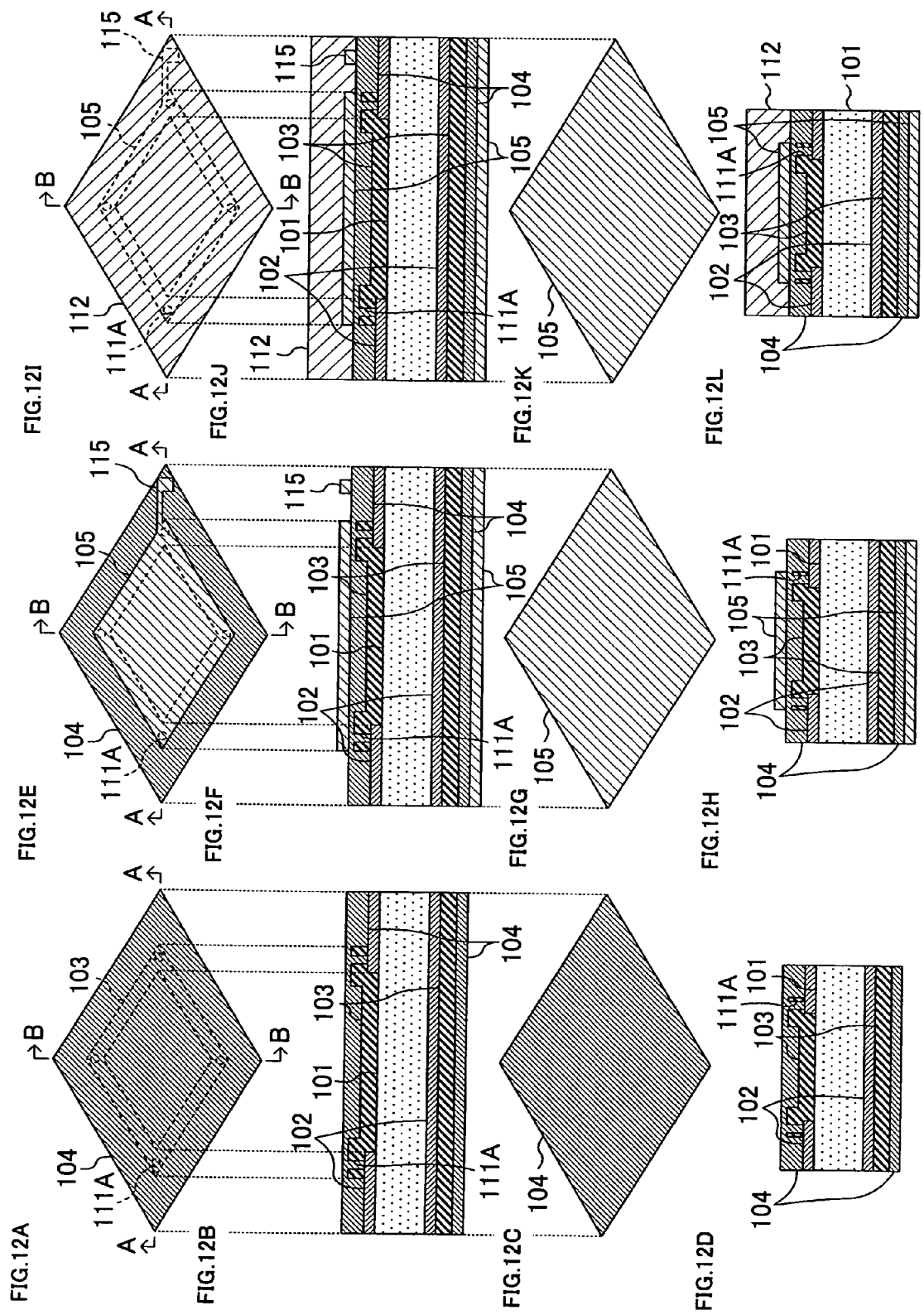

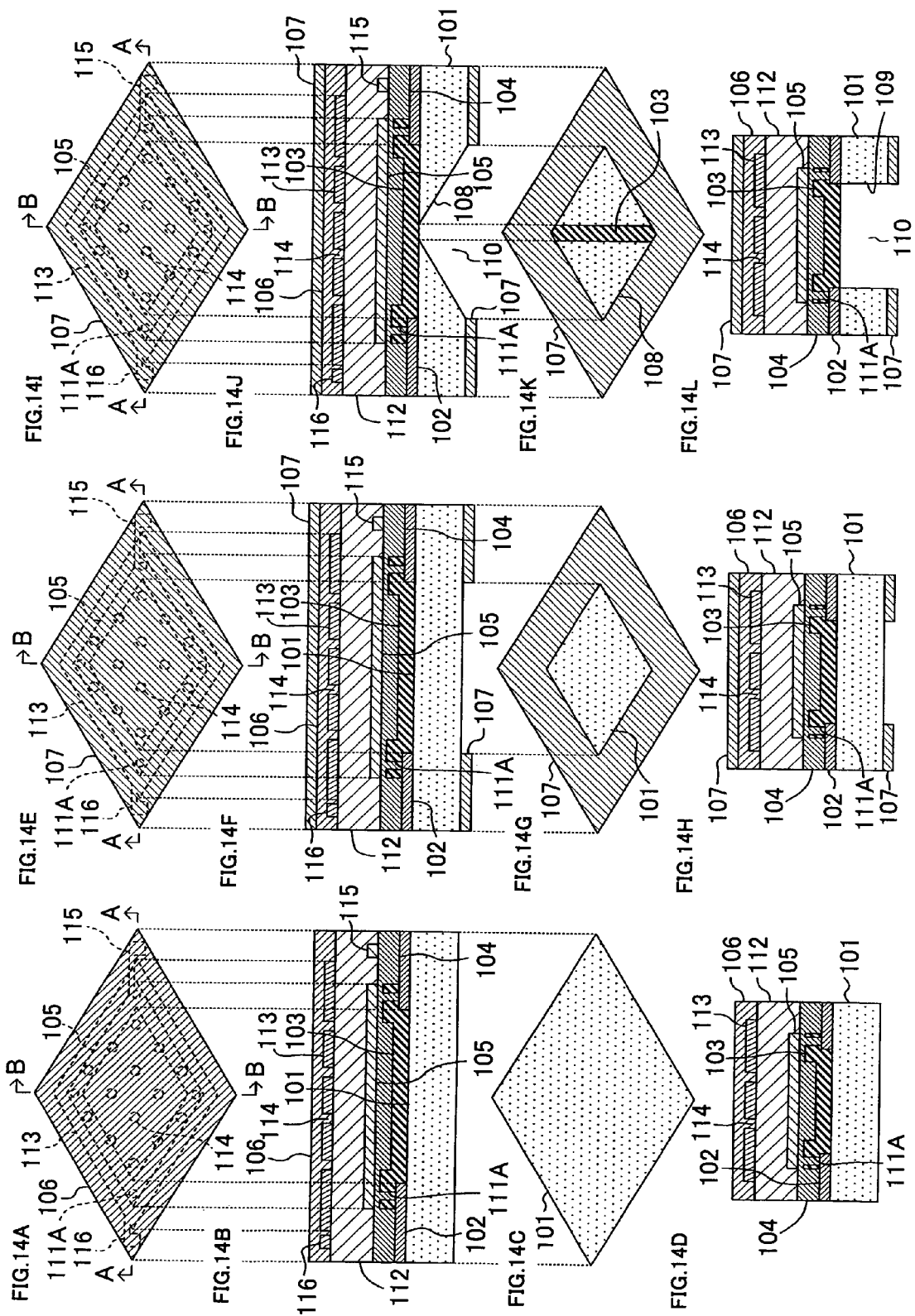

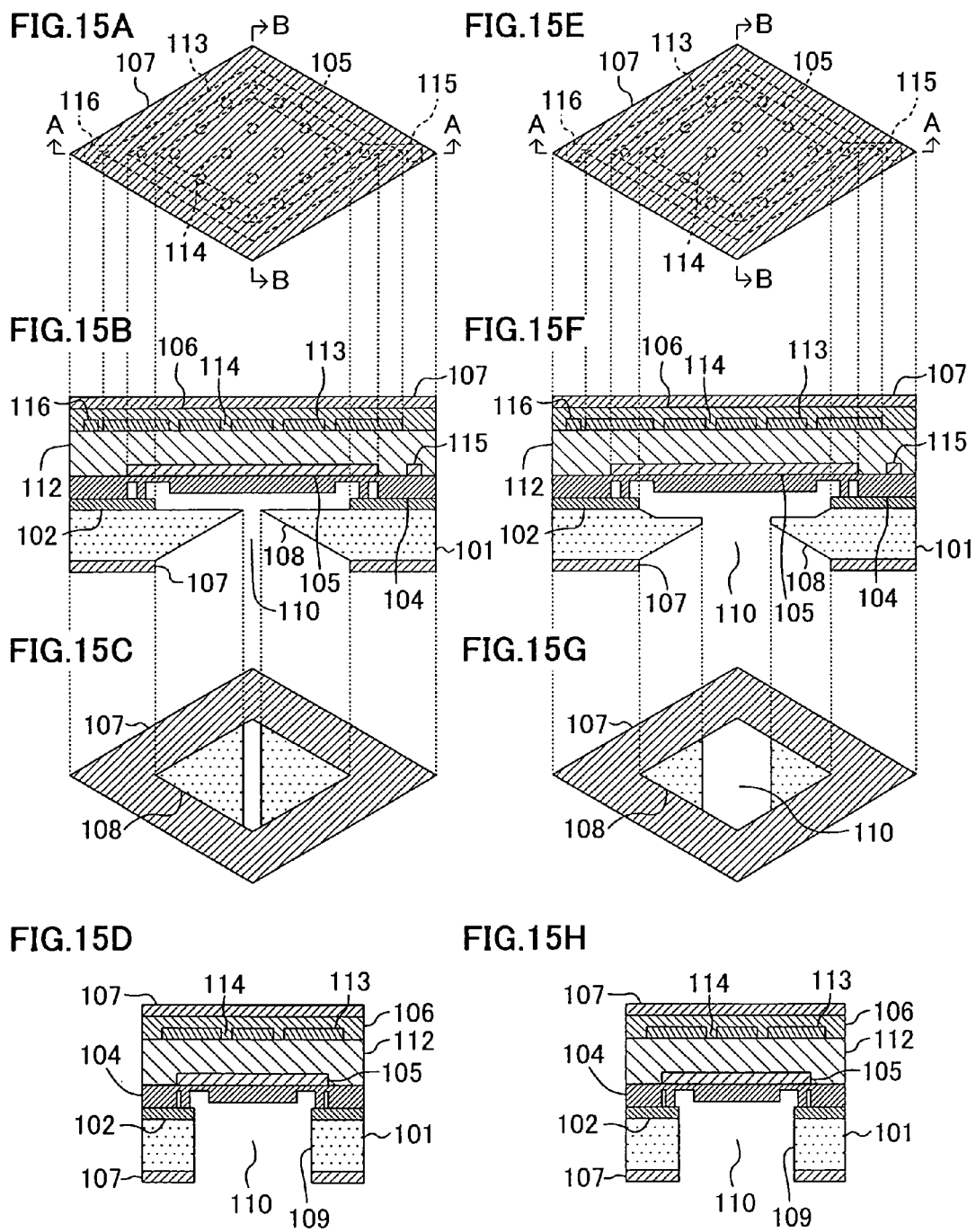

FIG.16A
FIG.16E
FIG.16B
FIG.16F
FIG.16C
FIG.16G
FIG.16D
FIG.16H
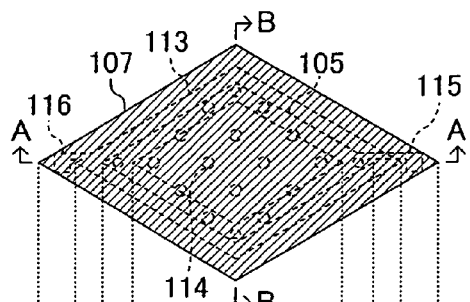
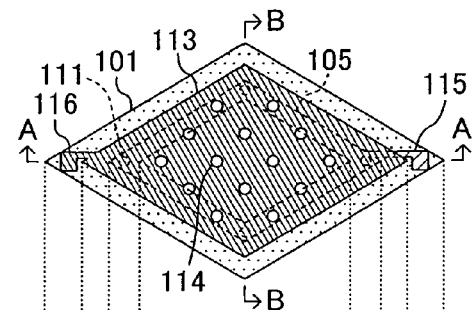
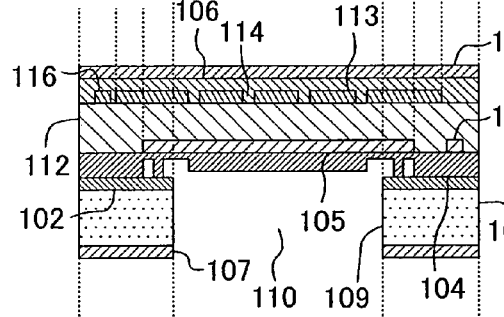
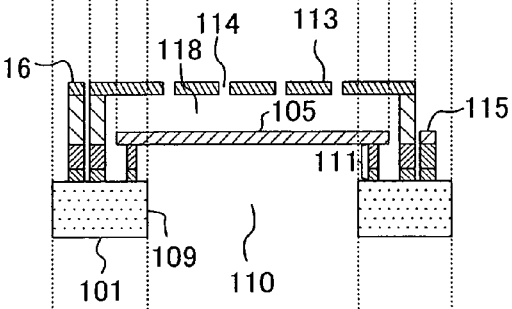
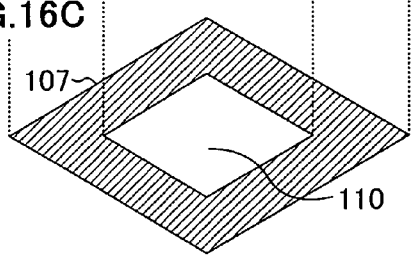
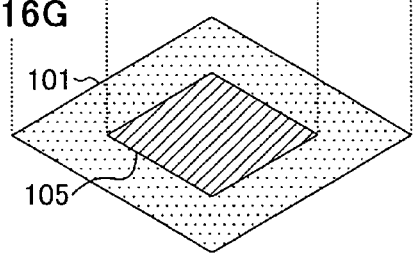
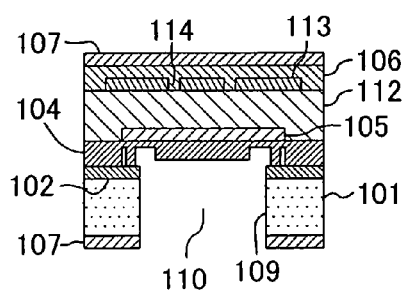
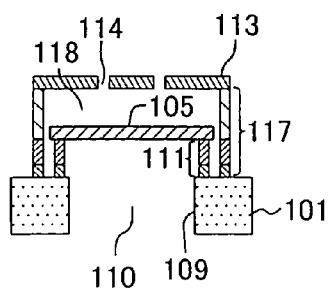

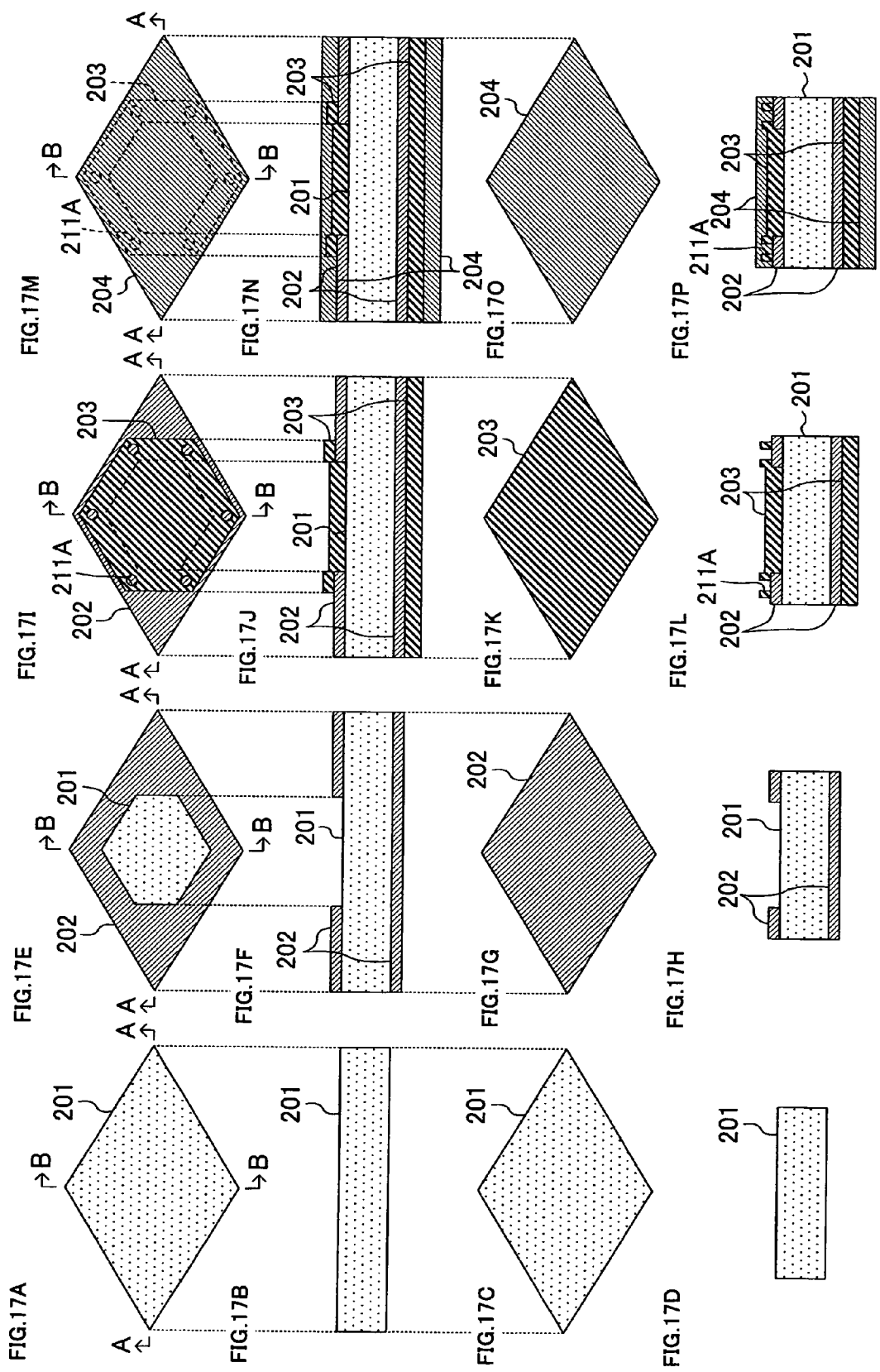

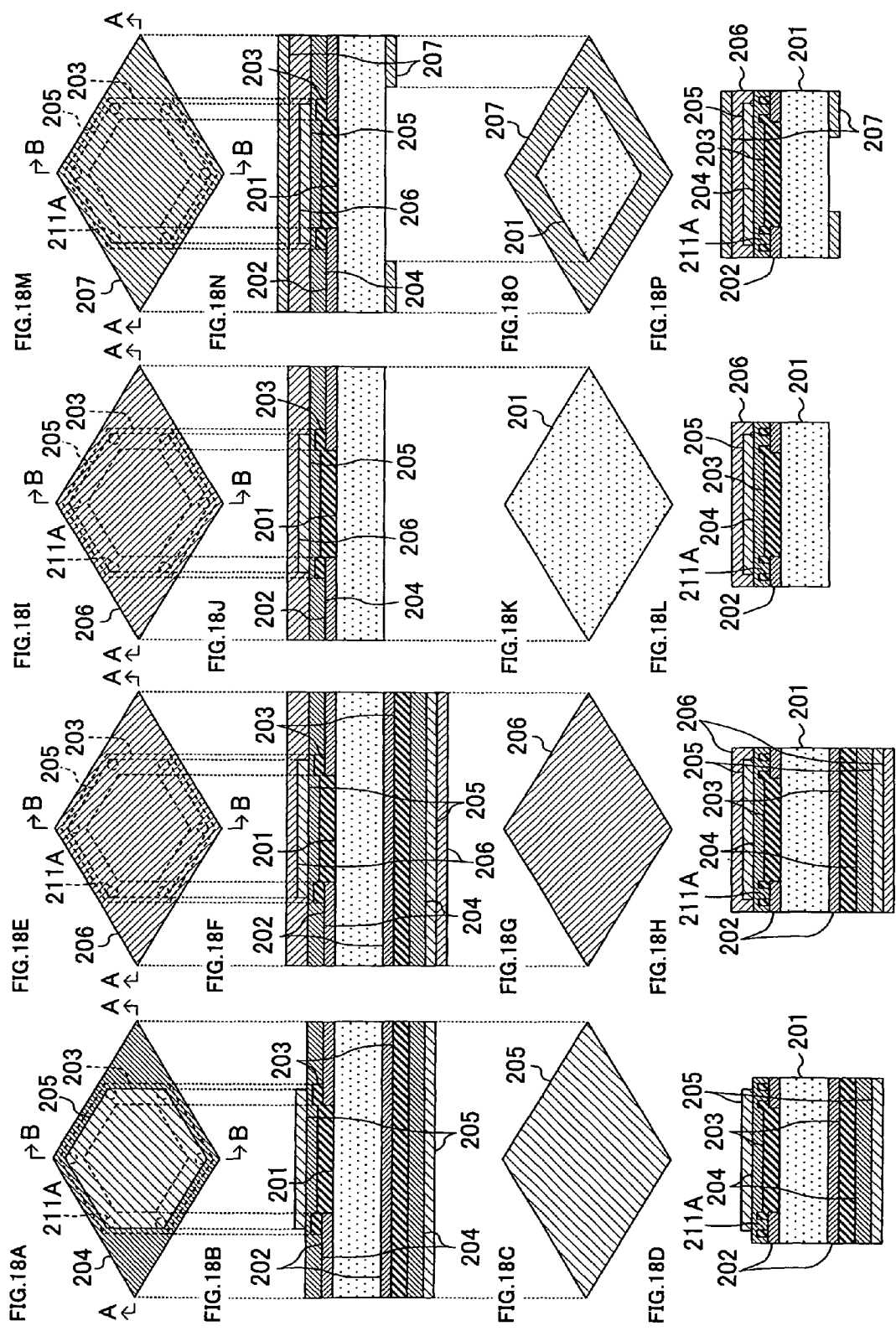

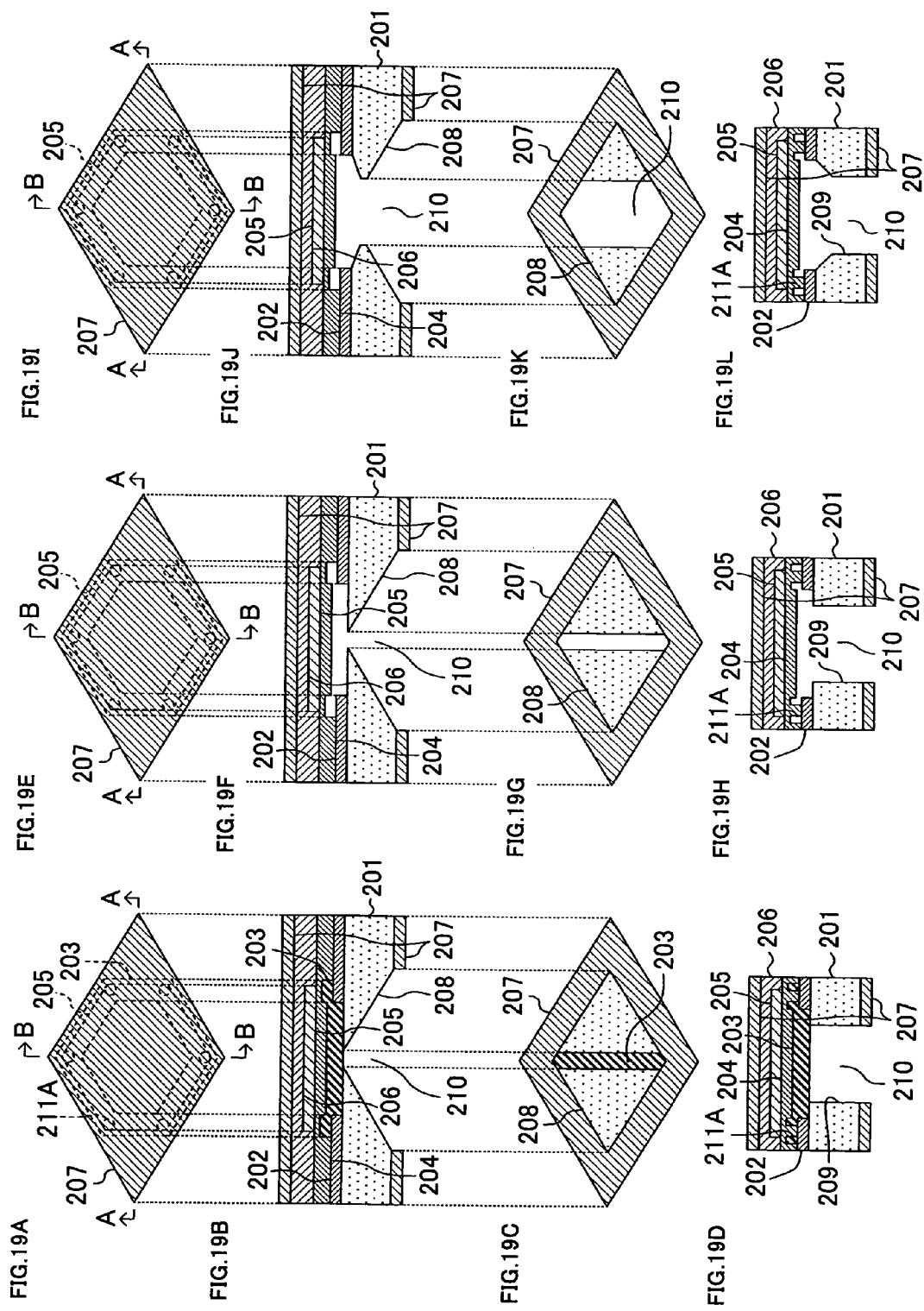

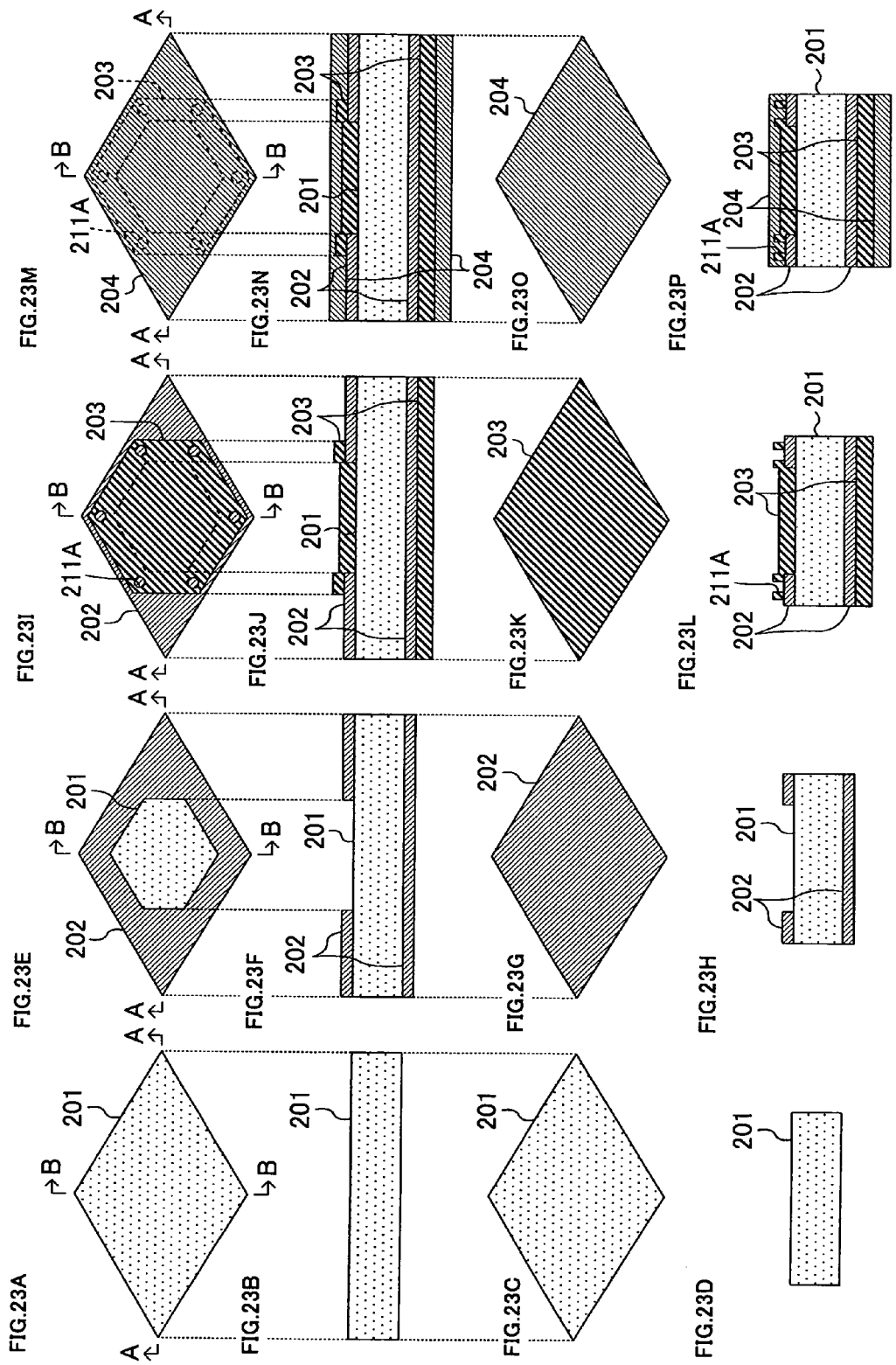

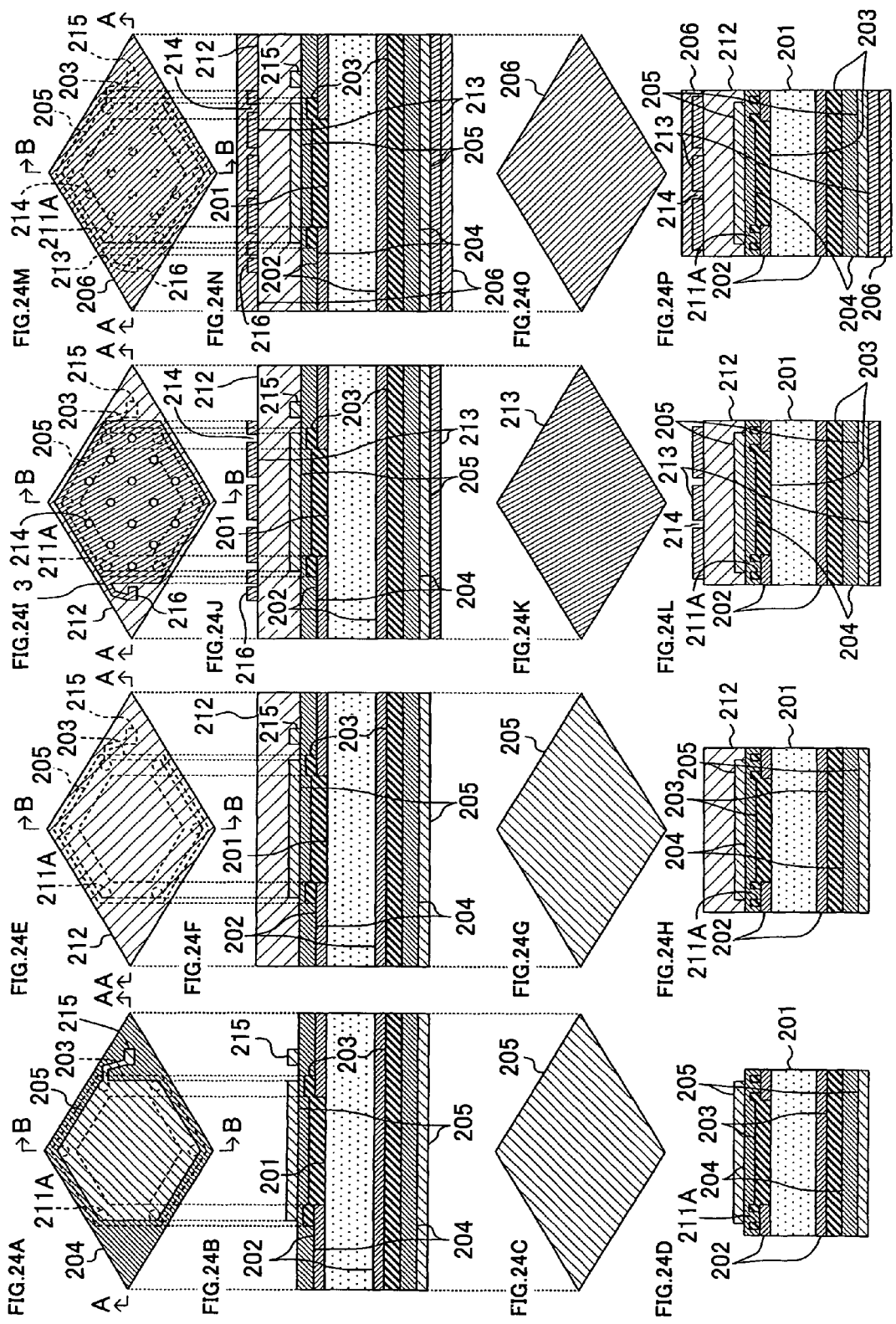

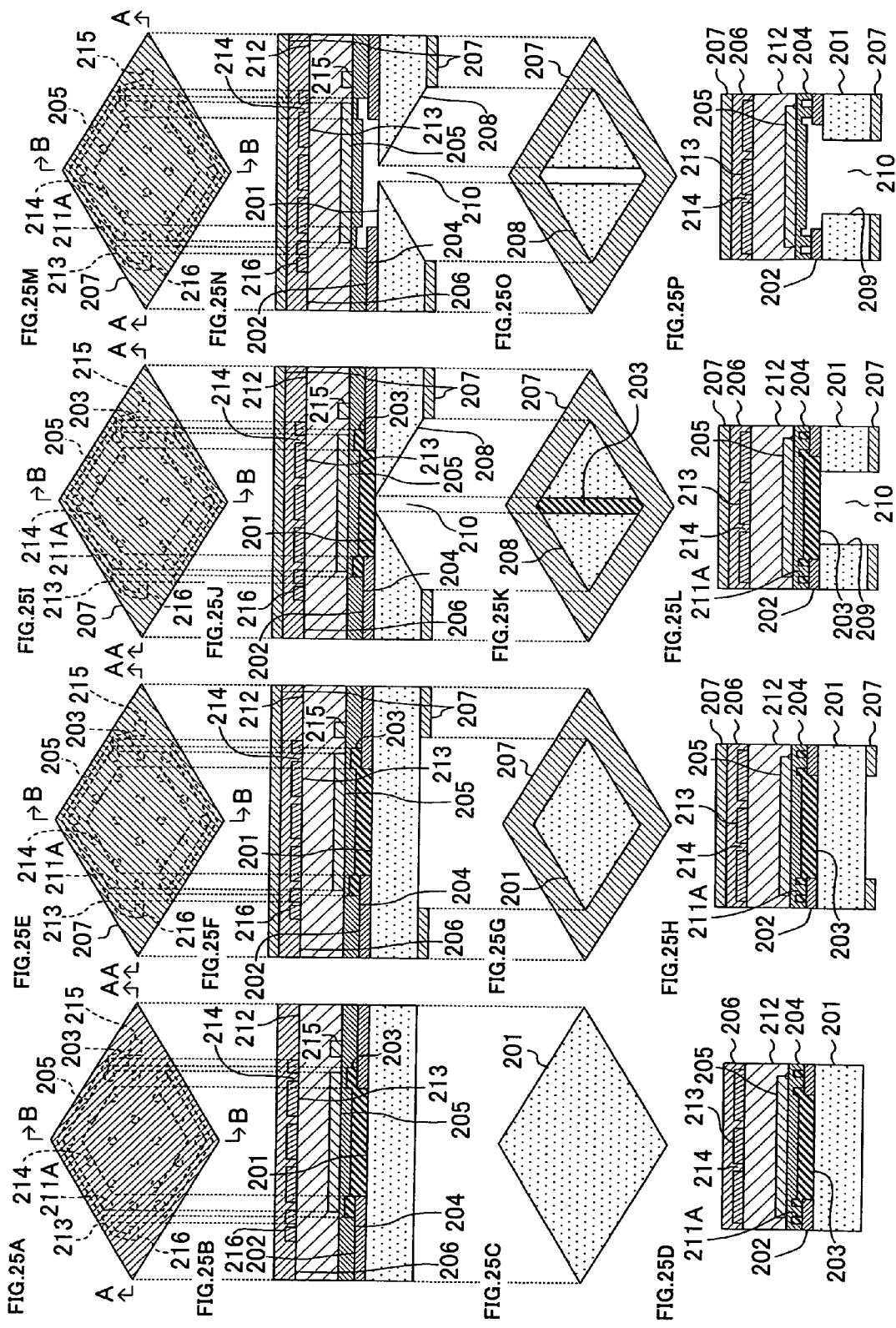

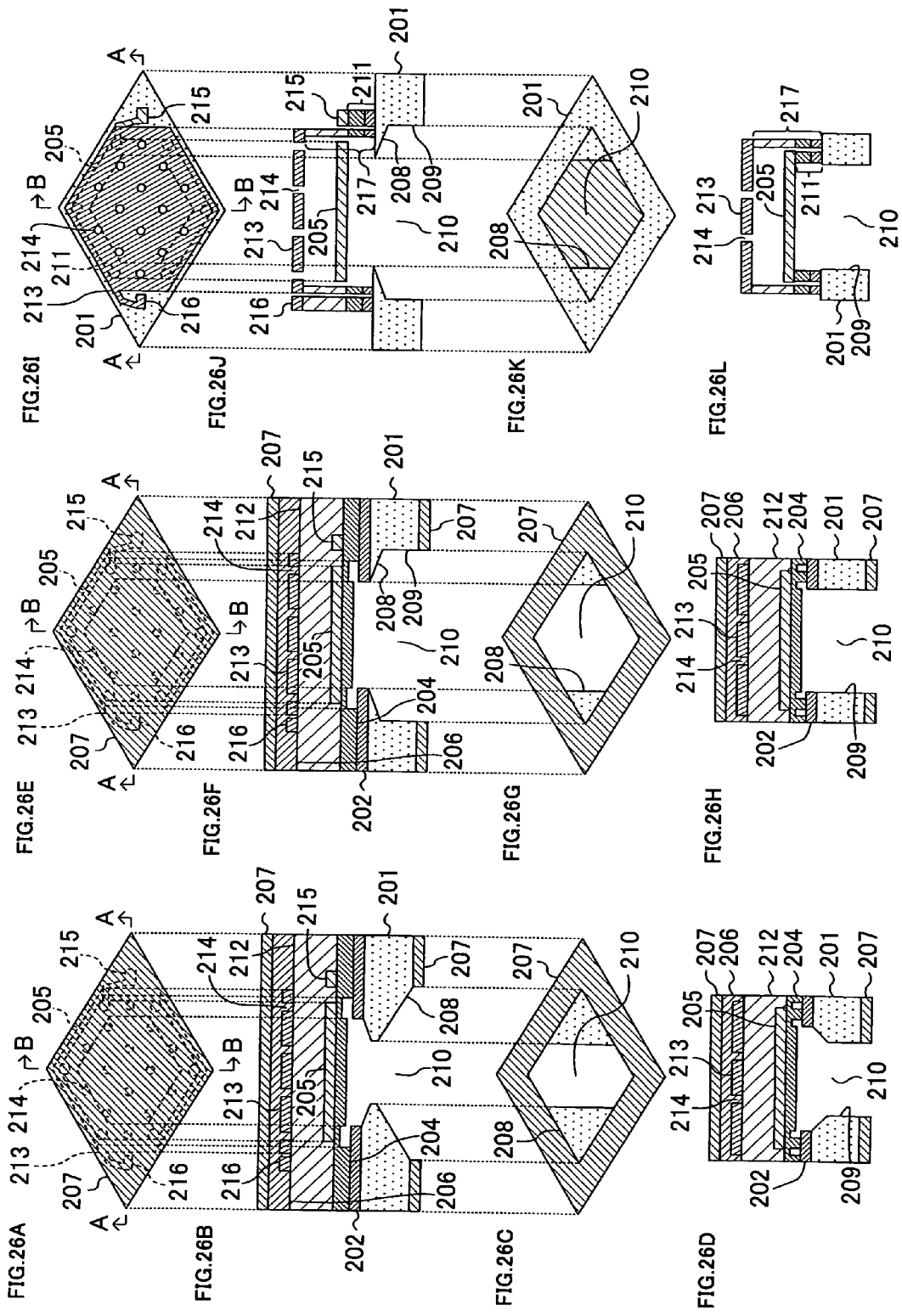

MEMS DEVICE AND METHOD FOR MANUFACTURING THE SAME

CROSS REFERENCE TO RELATED APPLICATION

This application claims priority under 35 U.S.C. §119 to Patent Application No. 2008-232628 filed in Japan on Sep. 10, 2008, the entire contents of which are hereby incorporated by reference.

BACKGROUND OF THE INVENTION

1. Field of the Invention

The present disclosure relates to a device such as a sensor manufactured based on MEMS (Micro Electro Mechanical Systems) techniques, and a method for manufacturing the same. More particularly, the present disclosure relates to a sonic sensor including a diaphragm that detects pressure variations and vibrates in response thereto and that is capable of transducing the vibration into an electric signal, and a method for manufacturing the same.

2. Description of the Background Art

A technique called "MEMS" has recently seen progress in the art, which utilizes miniature processing techniques used in the manufacture of semiconductor LSIs, e.g., techniques for processing silicon. Using the MEMS techniques, various miniature components such as, but not limited to, acceleration sensors, pressure sensors and sonic sensors have been developed and commercialized. Accordingly, there have been demands for applying MEMS to portable devices and downsizing MEMS chips for cost reduction.

In order to detect variations in acceleration or pressure, a sensor using MEMS techniques has a structure with a diaphragm film, which is to be a vibrating member, formed over a silicon substrate having a through hole therein (hereinafter referred to as a "diaphragm structure").

In one method for forming a through hole in a silicon substrate in order to realize a diaphragm structure, a silicon substrate having a (100) plane as the principal plane is subjected to anisotropic etching with an alkaline etchant such as KOH. This method produces a through hole in the silicon substrate, in which the inner wall surface of the through hole is the Si (111) crystal face being an inclined plane. With a through hole having such an inclined inner wall, the MEMS sensor chip will be large. In other words, the formation of a through hole whose inner wall surface is the Si (111) crystal face becomes a factor that inhibits the downsizing of a MEMS sensor chip.

As a solution to this problem, JP Laid-Open Patent Publication No. 2008-98524 discloses a method for downsizing a MEMS sensor chip by reducing the proportion of the Si (111) crystal face, i.e., the inclined plane, with respect to the area of the MEMS sensor chip.

FIGS. 27A and 27B are a plan view and a cross-sectional view, respectively, showing a conventional diaphragm structure disclosed in JP 2008-98524. As shown in FIGS. 27A and 27B, a conventional diaphragm structure 11 includes an Si substrate 12 having a (100) crystal face as the principal plane, and a device thin film (diaphragm) 13 formed on the Si substrate 12 with a holding section 18 interposed therebetween. The Si substrate 12 includes a through hole 14 running through the substrate 12 from the front surface to the reverse surface thereof, which is formed by wet-etching the Si substrate 12 from the reverse surface. The through hole 14 has a rectangular shape on the principal plane of the Si substrate 12, and the longitudinal and lateral sides of the rectangular shape run along the <110> orientation on the principal plane being the (100) crystal face. The inner wall of the through hole 14 includes inclined planes 15 and 17, each being the (111) crystal face or an equivalent crystal face formed at the front surface side and the reverse surface side of the Si substrate 12, and a vertical plane 16 connecting the inclined plane 15 and the inclined plane 17 with each other. Thus, the cross section of the through hole 14 is tapered at the front surface side and the reverse surface side of the Si substrate 12.

SUMMARY OF THE INVENTION

The diaphragm structure 11 disclosed in JP 2008-98524 is an effective way of ensuring a large size of the diaphragm even when the MEMS sensor chip is downsized.

However, if the chip is downsized when the diaphragm structure 11 is used as a sonic sensor, there are problems such as lowered sensitivity due to the reflection of the sound wave at the inclined planes 15 and 17 or due to the path for the sound wave coming in from the reverse surface side of the Si substrate 12 as viewed from the diaphragm 13 being narrowed midway along the path, because the cross section of the through hole 14 is tapered at the front surface side and the reverse surface side of the Si substrate 12. The inclined planes 15 and 17 are each the (111) crystal face or an equivalent crystal face, and therefore have an angle of about 35.3 degrees (more accurately, $\arctan((\sqrt{2})/2)$) with respect to the (100) crystal face being the principal plane. In other words, the inclined planes 15 and 17 have an angle of about 54.7 degrees with respect to the vertical plane 16.

Moreover, as the chip is downsized, the proportion of the area occupied by the inclined planes 15 and 17 with respect to the area occupied by the through hole 14 increases, thereby increasing the amount of reflection at the inclined planes 15 and 17 of the sound wave coming into the through hole 14 from the reverse surface side of the Si substrate 12 and increasing the resistance for the sound wave (air vibration) to pass through the through hole 14. Therefore, insufficient vibration is transmitted to the diaphragm 13, thereby further lowering the sensitivity of the device as a sonic sensor.

In view of the above, it is an object of the present disclosure to provide a diaphragm structure obtained by forming in a silicon substrate a through hole whose inner wall is vertical to the substrate principal plane using an inexpensive wet etching method, a MEMS device using such a diaphragm structure, and a method for manufacturing the same.

The present inventors conducted various research in order to achieve the object set forth above, and found that with a method for forming a through hole by forming a mask film with an opening pattern on the reverse surface of a silicon substrate and anisotropically etching the silicon substrate with an alkaline etchant to the front surface of the silicon substrate, it is possible to form, in a silicon substrate, a through hole with a substantially vertical inner wall by etching a silicon substrate having a (110) crystal face as the principal plane using a mask film having a substantially rhombic opening pattern.

The present disclosure will now be described in detail with reference to FIG. 28. FIG. 28 is a plan view showing a mask film with opening pattern formed on the reverse surface ((110) crystal face) of the silicon substrate. In FIG. 28, the broken line represents the <001> orientation on the substrate reverse surface being the (110) crystal face. The opening pattern, i.e., the rhombic shape A, shown in FIG. 28 has four sides each at an angle of about ±35.3 degrees (more accurately, $\arctan((\sqrt{2})/2)$) with respect to the broken line (the <001> orientation). If the reverse surface of the silicon substrate is anisotropically etched with an alkaline etchant with a mask film having such an opening pattern formed on the reverse surface of the silicon substrate, i.e., the (110) crystal face, it is possible to form a through hole whose inner wall surface is formed by the (−111) crystal face and the (1 −1 1) crystal face, which are vertical to the (110) crystal face.

In the present disclosure, while the longer one of the diagonals of the rhombic opening pattern (hereinafter referred to as the "longer diagonal") is preferably aligned with the <001> orientation, the inner wall of the through hole can be made substantially vertical to the substrate principal plane even if there is an angle (error) of about ±1 degree between the longer diagonal and the <001> orientation. This is because since the etching rate on a crystal face equivalent to the (110) crystal face is several tens of times greater than that on a crystal face equivalent to the (111) crystal face, the crystal face equivalent to the (111) crystal face formed along each side of the opening pattern, i.e., the substantially rhombic shape, will form the inner wall surface of the through hole.

Specifically, a MEMS device of the present disclosure includes: a substrate having a first principal plane and a second principal plane opposite to the first principal plane; a through hole formed in the substrate; and a vibrating film formed over the first principal plane so as to cover the through hole, wherein: the first principal plane and the second principal plane are both a (110) crystal face; and the through hole has a substantially rhombic shape on the second principal plane.

In the MEMS device of the present disclosure, the substrate may be a silicon substrate.

In the MEMS device of the present disclosure, the through hole may define inner walls of the substrate, and the inner walls may be substantially vertical relative to the second principle plane. In this case, the through hole may define inner walls of the substrate, and the inner walls may be substantially vertical relative to the first principal pane.

In the MEMS device of the present disclosure, the vibrating film may be partially held by a holding section.

In the MEMS device of the present disclosure, it is preferred that a first interior angle of the rhombic shape is in a range of 70.6±3 degrees; and a second interior angle of the rhombic shape is in a range of 109.4±3 degrees.

In the MEMS device of the present disclosure, it is preferred that a longer diagonal of the rhombic shape is substantially parallel to a <001> orientation on the second principal plane being a (110) crystal face.

In the MEMS device of the present disclosure, the through hole may have a substantially rhombic shape on the first principal plane. In such a case, the shape of the through hole on the first principal plane may correspond to the shape of the through hole on the second principal plane, and the vibrating film may have a substantially rhombic shape.

In the MEMS device of the present disclosure, a size of the through hole on the first principal plane may be smaller than a size of the through hole on the second principal plane.

In the MEMS device of the present disclosure, the through hole may have a substantially hexagonal shape on the first principal plane. In such a case, it is preferred that two of corner portions of the hexagonal shape that are opposing each other have a first interior angle in a range of 109.4±3 degrees; and the other four of the corner portions of the hexagonal shape have a second interior angle in a range of 125.3±3 degrees. In such a case, it is preferred that a side extending between adjacent ones of the second interior angles of the hexagonal shape is substantially vertical to a <001> orientation on the first principal plane being a (110) crystal face. In such a case, the vibrating film may have a substantially hexagonal shape.

In the MEMS device of the present disclosure, the silicon substrate may have a substantially rhombic shape.

The MEMS device of the present disclosure may further include: a fixed film formed over the vibrating film so as to oppose the vibrating film; and an air gap interposed between the vibrating film and the fixed film. Then, a function of a sonic sensor can be realized by, for example, utilizing the fact that the capacitance between the vibrating film (diaphragm film) and the fixed film (fixed electrode film) is varied by the vibration of the diaphragm film.

A method for manufacturing a MEMS device of the present disclosure includes the steps of: (a) forming a sacrificial layer on a first principal plane of a substrate having the first principal plane and a second principal plane opposite to the first principal plane; (b) forming a vibrating film over the sacrificial layer; (c) etching the substrate from a side of the second principal plane to thereby form a through hole in the substrate; and (d) supplying an etchant through the through hole, thereby removing the sacrificial layer and expanding the through hole from a side of the first principal plane, wherein: the first principal plane and the second principal plane are both a (110) crystal face; and the through hole has a substantially rhombic shape on the second principal plane.

In the method for manufacturing a MEMS device of the present disclosure, the substrate may be a silicon substrate.

In the method for manufacturing a MEMS device of the present disclosure, the through hole may define inner walls of the substrate, and the inner walls may be substantially vertical relative to the second principal plane. In this case, the through hole may define inner walls of the substrate, and the inner walls may be substantially vertical relative to the first principal plane.

In the method for manufacturing a MEMS device of the present disclosure, the vibration film may be partially held by a holding section.

In the method for manufacturing a MEMS device of the present disclosure, it is preferred that a first interior angle of the rhombic shape is in a range of 70.6±3 degrees; and a second interior angle of the rhombic shape is in a range of 109.4±3 degrees.

In the method for manufacturing a MEMS device of the present disclosure, it is preferred that a longer diagonal of the rhombic shape is substantially parallel to a <001> orientation on the second principal plane being a (110) crystal face.

In the method for manufacturing a MEMS device of the present disclosure, the through hole may have a substantially rhombic shape on the first principal plane after completion of the step (d). In such a case, the shape of the through hole on the first principal plane after completion of the step (d) may correspond to the shape of the through hole on the second principal plane after completion of the step (d), and the vibrating film may have a substantially rhombic shape.

In the method for manufacturing a MEMS device of the present disclosure, a size of the through hole on the first principal plane after completion of the step (d) may be smaller than a size of the through hole on the second principal plane after completion of the step (d).

In the method for manufacturing a MEMS device of the present disclosure, the through hole may have a substantially hexagonal shape on the first principal plane after completion of the step (d). In such a case, it is preferred that two of corner portions of the hexagonal shape that are opposing each other have a first interior angle in a range of 109.4±3 degrees; and the other four of the corner portions of the hexagonal shape have a second interior angle in a range of 125.3±3 degrees. In such a case, it is preferred that a side extending between adjacent ones of the second interior angles of the hexagonal shape is substantially vertical to a <001> orientation on the first principal plane being a (110) crystal face. In such a case, the vibrating film may have a substantially hexagonal shape.

In the method for manufacturing a MEMS device of the present disclosure, the silicon substrate may have a substantially rhombic shape.

The method for manufacturing a MEMS device of the present disclosure may further include, after the step (b), a step (e) of forming a fixed film over the vibrating film with a sacrificial film interposed therebetween and then removing the sacrificial film to thereby form an air gap between the vibrating film and the fixed film. Then, a function of a sonic sensor can be realized by, for example, utilizing the fact that the capacitance between the vibrating film (diaphragm film) and the fixed film (fixed electrode film) is varied by the vibration of the diaphragm film.

A device of the present disclosure includes: a substrate having a first principal plane and a second principal plane opposite to the first principal plane; and a through hole formed in the substrate; wherein: the first principal plane and the second principal plane are both a (110) crystal face; and the through hole has a substantially rhombic shape on the second principal plane.

In the device of the present disclosure, the substrate may be a silicon substrate.

In the device of the present disclosure, the through hole may define inner walls of the substrate, and the inner walls may be substantially vertical relative to the second principal plane. In this case, the through hole may define inner walls of the substrate, and the inner walls may be substantially vertical relative to the first principal plane.

A method for manufacturing a device of the present disclosure includes the steps of: (a) forming a sacrificial layer on a first principal plane of a substrate having the first principal plane and a second principal plane opposite to the first principal plane; (b) etching the substrate from a side of the second principal plane to thereby form a through hole in the substrate; and (c) supplying an etchant through the through hole, thereby removing the sacrificial layer and expanding the through hole from a side of the first principal plane, wherein: the first principal plane and the second principal plane are both a (110) crystal face; and the through hole has a substantially rhombic shape on the second principal plane.

In the method of manufacturing a device of the present disclosure, the substrate may be a silicon substrate.

In the method of manufacturing a device of the present disclosure, the through hole may define inner walls of the substrate, and the inner walls may be substantially vertical relative to the second principal plane. In this case, the through hole may define inner walls of the substrate, and the inner walls may be substantially vertical relative to the first principal plane.

According to the present disclosure, in a diaphragm structure used in various sensors, the inner wall of the through hole can be formed vertical to the substrate principal plane. In other words, it is possible to prevent the through hole in the silicon substrate from being tapered, as in a conventional structure disclosed in, for example, JP 2008-98524. Thus, it is possible to downsize the planar shape of the diaphragm structure. Since the through hole includes no tapered portions, it is possible to eliminate the influence of the reflection of the sound wave at such tapered portions. Moreover, since the path for the sound wave coming in from the substrate reverse surface side as viewed from the diaphragm (vibrating film) is not narrowed midway along the path, it is possible to substantially reduce the resistance (air resistance) for the sound wave (air vibration) to pass through the through hole. Thus, sufficient sound waves (air vibrations) are transmitted to the diaphragm. Therefore, if a MEMS device of the present disclosure is used as a sonic sensor, for example, it is possible to prevent a deterioration in the acoustic performance such as lowered sensitivity.

Therefore, according to the present disclosure, it is possible to provide a diaphragm structure obtained by forming in a silicon substrate a through hole whose inner wall is vertical to the substrate principal plane using an inexpensive wet etching method, a MEMS device using such a diaphragm structure, and a method for manufacturing the same.

In a case where the diaphragm (vibrating film) has a hexagonal shape in the present disclosure, it is possible to suppress the stress localization at a diaphragm corner portion, thereby preventing the diaphragm from being broken in the corner portion. Thus, it is possible to realize a diaphragm structure with longer lifetime and better performance, and a MEMS device such as a sonic sensor using the same.

As described above, the present disclosure is directed to a device such as a sensor using MEMS techniques and a method for manufacturing the same, and the present disclosure is very useful as it is capable of realizing a diaphragm structure for detecting pressure variations and a MEMS device using the same.

BRIEF DESCRIPTION OF THE DRAWINGS

FIGS. 1A to 1P are exemplary illustrations each showing a step in a method for manufacturing a MEMS device according to a first embodiment of the present disclosure, wherein FIGS. 1A, 1E, 1I and 1M are plan views, FIGS. 1B, 1F, 1J and 1N are cross-sectional views taken along line A-A of FIGS. 1A, 1E, 1I and 1M, respectively, FIGS. 1C, 1G, 1K and 1O are bottom views, and FIGS. 1D, 1H, 1L and 1P are cross-sectional views taken along line B-B of FIGS. 1A, 1E, 1I and 1M, respectively.

FIGS. 2A to 2P are exemplary illustrations each showing a step in the method for manufacturing a MEMS device according to the first embodiment of the present disclosure, FIGS. 2A, 2E, 2I and 2M are plan views, FIGS. 2B, 2F, 2J and 2N are cross-sectional views taken along line A-A of FIGS. 2A, 2E, 2I and 2M, respectively, FIGS. 2C, 2G, 2K and 2O are bottom views, and FIGS. 2D, 2H, 2L and 2P are cross-sectional views taken along line B-B of FIGS. 2A, 2E, 2I and 2M, respectively.

FIGS. 3A to 3L are exemplary illustrations each showing a step in the method for manufacturing a MEMS device according to the first embodiment of the present disclosure, FIGS. 3A, 3E and 3I are plan views, FIGS. 3B, 3F and 3J are cross-sectional views taken along line A-A of FIGS. 3A, 3E and 3I, respectively, FIGS. 3C, 3G and 3K are bottom views, and FIGS. 3D, 3H and 3L are cross-sectional views taken along line B-B of FIGS. 3A, 3E and 3I, respectively.

FIGS. 4A to 4H are exemplary illustrations each showing a step in the method for manufacturing a MEMS device according to the first embodiment of the present disclosure, FIGS. 4A and 4E are plan views, FIGS. 4B and 4F are cross-sectional views taken along line A-A of FIGS. 4A and 4E, respectively, FIGS. 4C and 4G are bottom views, and FIGS. 4D and 4H are cross-sectional views taken along line B-B of FIGS. 4A and 4E, respectively.

FIGS. 6A to 6P are exemplary illustrations each showing a step in a method for manufacturing a MEMS device according to a first variation of the first embodiment of the present disclosure, FIGS. 6A, 6E, 6I and 6M are plan views, FIGS. 6B, 6F, 6J and 6N are cross-sectional views taken along line A-A of FIGS. 6A, 6E, 6I and 6M, respectively, FIGS. 6C, 6G, 6K and 6O are bottom views, and FIGS. 6D, 6H, 6L and 6P are cross-sectional views taken along line B-B of FIGS. 6A, 6E, 6I and 6M, respectively.

FIGS. 7A to 7P are exemplary illustrations each showing a step in the method for manufacturing a MEMS device according to the first variation of the first embodiment of the present disclosure, FIGS. 7A, 7E, 7I and 7M are plan views, FIGS. 7B, 7F, 7J and 7N are cross-sectional views taken along line A-A of FIGS. 7A, 7E, 7I and 7M, respectively, FIGS. 7C, 7G, 7K and 7O are bottom views, and FIGS. 7D, 7H, 7L and 7P are cross-sectional views taken along line B-B of FIGS. 7A, 7E, 7I and 7M, respectively.

FIGS. 8A to 8L are exemplary illustrations each showing a step in the method for manufacturing a MEMS device according to the first variation of the first embodiment of the present disclosure, FIGS. 8A, 8E and 8I are plan views, FIGS. 8B, 8F and 8J are cross-sectional views taken along line A-A of FIGS. 8A, 8E and 8I, respectively, FIGS. 8C, 8G and 8K are bottom views, and FIGS. 8D, 8H and 8L are cross-sectional views taken along line B-B of FIGS. 8A, 8E and 8I, respectively.

FIGS. 9A and 9E are plan views, FIGS. 9B and 9F are cross-sectional views taken along line A-A of FIGS. 9A and 9E, respectively, FIGS. 9C and 9G are bottom views, and FIGS. 9D and 9H are cross-sectional views taken along line B-B of FIGS. 9A and 9E, respectively.

FIGS. 10A to 10D are exemplary illustrations showing a structure of a sonic sensor according to a second variation of the first embodiment of the present disclosure, wherein FIG. 10A is a plan view, FIG. 10B is a cross-sectional view taken along line A-A of FIG. 10A, FIG. 10C is a bottom view, and FIG. 10D is a cross-sectional view taken along line B-B of FIG. 10A.

FIGS. 11A to 11L are exemplary illustrations each showing a step in a method for manufacturing a MEMS device according to the second variation of the first embodiment of the present disclosure, FIGS. 11A, 11E and 11I are plan views, FIGS. 11B, 11F and 11J are cross-sectional views taken along line A-A of FIGS. 11A, 11E and 11I, respectively, FIGS. 11C, 11G and 11K are bottom views, and FIGS. 11D, 11H and 11L are cross-sectional views taken along line B-B of FIGS. 11A, 11E and 11I, respectively.

FIGS. 12A to 12L are exemplary illustrations each showing a step in the method for manufacturing a MEMS device according to the second variation of the first embodiment of the present disclosure, FIGS. 12A, 12E and 12I are plan views, FIGS. 12B, 12F and 12J are cross-sectional views taken along line A-A of FIGS. 12A, 12E and 12I, respectively, FIGS. 12C, 12G and 12K are bottom views, and FIGS. 12D, 12H and 12L are cross-sectional views taken along line B-B of FIGS. 12A, 12E and 12I, respectively.

FIGS. 13A and 13E are plan views, FIGS. 13B and 13F are cross-sectional views taken along line A-A of FIGS. 13A and 13E, respectively, FIGS. 13C and 13G are bottom views, and FIGS. 13D and 13H are cross-sectional views taken along line B-B of FIGS. 13A and 13E, respectively.

FIGS. 14A to 14L are exemplary illustrations each showing a step in the method for manufacturing a MEMS device according to the second variation of the first embodiment of the present disclosure, FIGS. 14A, 14E and 14I are plan views, FIGS. 14B, 14F and 14J are cross-sectional views taken along line A-A of FIGS. 14A, 14E and 14I, respectively, FIGS. 14C, 14G and 14K are bottom views, and FIGS. 14D, 14H and 14L are cross-sectional views taken along line B-B of FIGS. 14A, 14E and 14I, respectively.

FIGS. 15A to 15H are exemplary illustrations each showing a step in the method for manufacturing a MEMS device according to the second variation of the first embodiment of the present disclosure, FIGS. 15A and 15E are plan views, FIGS. 15B and 15F are cross-sectional views taken along line A-A of FIGS. 15A and 15E, respectively, FIGS. 15C and 15G are bottom views, and FIGS. 15D and 15H are cross-sectional views taken along line B-B of FIGS. 15A and 15E, respectively.

FIGS. 16A to 16H are exemplary illustrations each showing a step in the method for manufacturing a MEMS device according to the second variation of the first embodiment of the present disclosure, FIGS. 16A and 16E are plan views, FIGS. 16B and 16F are cross-sectional views taken along line A-A of FIGS. 16A and 16E, respectively, FIGS. 16C and 16G are bottom views, and FIGS. 16D and 16H are cross-sectional views taken along line B-B of FIGS. 16A and 16E, respectively.

FIGS. 17A to 17P are exemplary illustrations each showing a step in a method for manufacturing a MEMS device according to a second embodiment of the present disclosure, FIGS. 17A, 17E, 17I and 17M are plan views, FIGS. 17B, 17F, 17J and 17N are cross-sectional views taken along line A-A of FIGS. 17A, 17E, 17I and 17M, respectively, FIGS. 17C, 17G, 17K and 17O are bottom views, and FIGS. 17D, 17H, 17L and 17P are cross-sectional views taken along line B-B of FIGS. 17A, 17E, 17I and 17M, respectively.

FIGS. 18A to 18P are exemplary illustrations each showing a step in the method for manufacturing a MEMS device according to the second embodiment of the present disclosure, FIGS. 18A, 18E, 18I and 18M are plan views, FIGS. 18B, 18F, 18J and 18N are cross-sectional views taken along line A-A of FIGS. 18A, 18E, 18I and 18M, respectively, FIGS. 18C, 18G, 18K and 18O are bottom views, and FIGS. 18D, 18H, 18L and 18P are cross-sectional views taken along line B-B of FIGS. 18A, 18E, 18I and 18M, respectively.

FIGS. 19A to 19L are exemplary illustrations each showing a step in the method for manufacturing a MEMS device according to the second embodiment of the present disclosure, FIGS. 19A, 19E and 19I are plan views, FIGS. 19B, 19F and 19J are cross-sectional views taken along line A-A of FIGS. 19A, 19E and 19I, respectively, FIGS. 19C, 19G and 19K are bottom views, and FIGS. 19D, 19H and 19L are cross-sectional views taken along line B-B of FIGS. 19A, 19E and 19I, respectively.

FIGS. 20A and 20E are plan views, FIGS. 20B and 20F are cross-sectional views taken along line A-A of FIGS. 20A and 20E, respectively, FIGS. 20C and 20G are bottom views, and FIGS. 20D and 20H are cross-sectional views taken along line B-B of FIGS. 20A and 20E, respectively.

FIGS. 22A to 22D are exemplary illustrations showing a structure of a sonic sensor according to a variation of the second embodiment of the present disclosure, wherein FIG. 22A is a plan view, FIG. 22B is a cross-sectional view taken along line A-A of FIG. 22A, FIG. 22C is a bottom view, and FIG. 22D is a cross-sectional view taken along line B-B of FIG. 22A.

FIGS. 23A to 23P are exemplary illustrations each showing a step in a method for manufacturing a MEMS device according to the variation of the second embodiment of the present disclosure, FIGS. 23A, 23E, 23I and 23M are plan views, FIGS. 23B, 23F, 23J and 23N are cross-sectional views taken along line A-A of FIGS. 23A, 23E, 23I and 23M, respectively, FIGS. 23C, 23G, 23K and 23O are bottom views, and FIGS. 23D, 23H, 23L and 23P are cross-sectional views taken along line B-B of FIGS. 23A, 23E, 23I and 23M, respectively.

FIGS. 24A to 24P are exemplary illustrations each showing a step in the method for manufacturing a MEMS device according to the variation of the second embodiment of the present disclosure, FIGS. 24A, 24E, 24I and 24M are plan views, FIGS. 24B, 24F, 24J and 24N are cross-sectional views taken along line A-A of FIGS. 24A, 24E, 24I and 24M, respectively, FIGS. 24C, 24G, 24K and 24O are bottom views, and FIGS. 24D, 24H, 24L and 24P are cross-sectional views taken along line B-B of FIGS. 24A, 24E, 24I and 24M, respectively.

FIGS. 25A to 25P are exemplary illustrations each showing a step in the method for manufacturing a MEMS device according to the variation of the second embodiment of the present disclosure, FIGS. 25A, 25E, 25I and 25M are plan views, FIGS. 25B, 25F, 25J and 25N are cross-sectional views taken along line A-A of FIGS. 25A, 25E, 25I and 25M, respectively, FIGS. 25C, 25G, 25K and 25O are bottom views, and FIGS. 25D, 25H, 25L and 25P are cross-sectional views taken along line B-B of FIGS. 25A, 25E, 25I and 25M, respectively.

FIGS. 26A to 26L are exemplary illustrations each showing a step in the method for manufacturing a MEMS device according to the variation of the second embodiment of the present disclosure, FIGS. 26A, 26E and 26I are plan views, FIGS. 26B, 26F and 26J are cross-sectional views taken along line A-A of FIGS. 26A, 26E and 26I, respectively, FIGS. 26C, 26G and 26K are bottom views, and FIGS. 26D, 26H and 26L are cross-sectional views taken along line B-B of FIGS. 26A, 26E and 26I, respectively.

DETAILED DESCRIPTION OF THE INVENTION

First Embodiment

Figure 5:
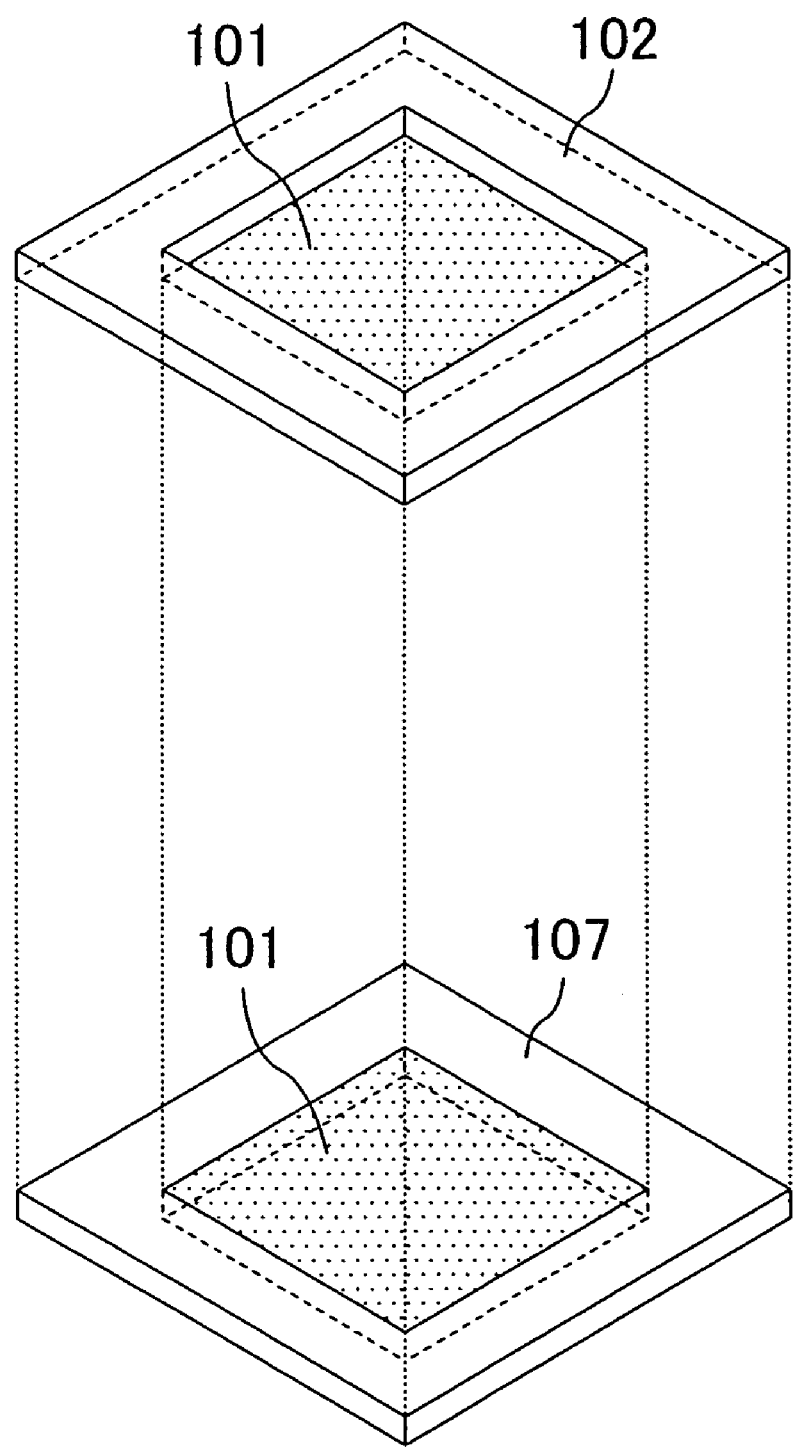
FIG. 5 is a perspective view showing an opening pattern for controlling the sacrificial layer shape formed in a thin film on the front surface of the silicon substrate in the step shown in FIGS. 1E to 1H, in comparison with an opening pattern formed in a thin mask film on the reverse surface of the silicon substrate in the step shown in FIGS. 2M to 2P.
Figure 9A:
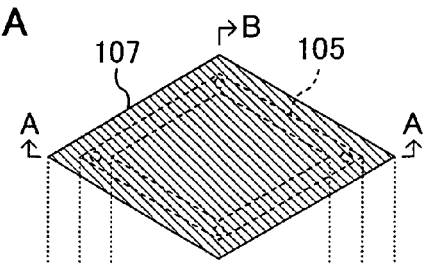
FIGS. 9A to 9H are exemplary illustrations each showing a step in the method for manufacturing a MEMS device according to the first variation of the first embodiment of the present disclosure.
Figure 9B:
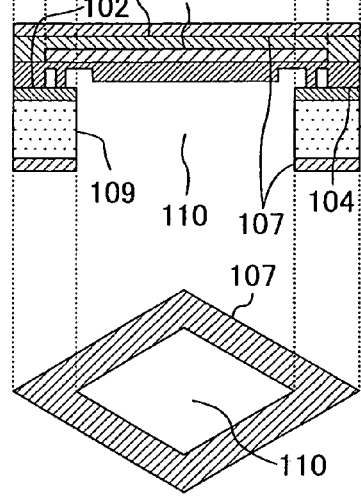
Figure 9C:
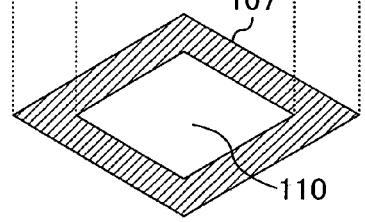
Figure 9D:
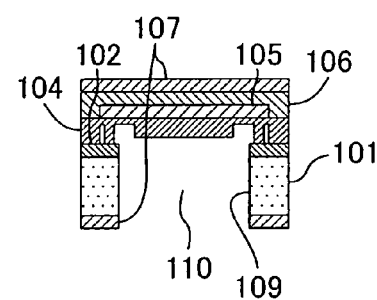
Figure 9E:
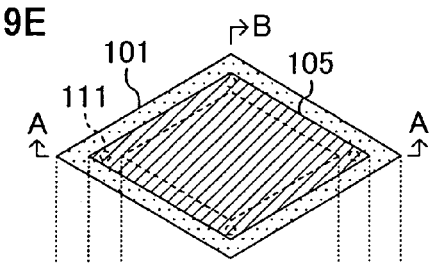
Figure 9F:
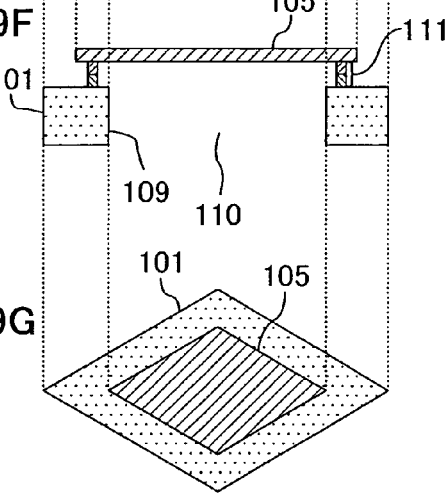
Figure 9G:
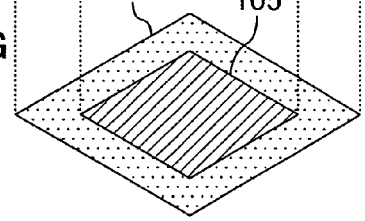
Figure 9H:
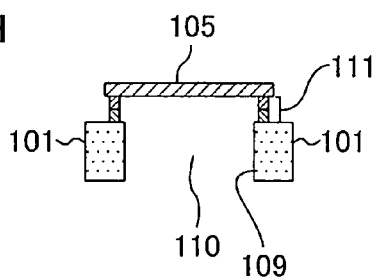

A MEMS device according to a first embodiment of the present disclosure, more specifically a MEMS device having a diaphragm structure used in various sensors, and a method for manufacturing the same will be described with reference to the drawings.

FIGS. 1A to 1P, 2A to 2P, 3A to 3L and 4A to 4H are exemplary illustrations each showing a step in a method for manufacturing a MEMS device of the present embodiment. FIGS. 1A, 1E, 1I, 1M, 2A, 2E, 2I, 2M, 3A, 3E, 3I, 4A and 4E are plan views, FIGS. 1B, 1F, 1J, 1N, 2B, 2F, 2J, 2N, 3B, 3F, 3J, 4B and 4F are cross-sectional views taken along line A-A of FIGS. 1A, 1E, 1I, 1M, 2A, 2E, 2I, 2M, 3A, 3E, 3I, 4A and 4E, respectively, FIGS. 1C, 1G, 1K, 1O, 2C, 2G, 2K, 2O, 3C, 3G, 3K, 4C and 4G are bottom views, and FIGS. 1D, 1H, 1L, 1P, 2D, 2H, 2L, 2P, 3D, 3H, 3L, 4D and 4H are cross-sectional views taken along line B-B of FIGS. 1A, 1E, 1I, 1M, 2A, 2E, 2I, 2M, 3A, 3E, 3I, 4A and 4E, respectively.

First, as shown in FIGS. 1A to 1D, there is provided a substantially rhombic silicon substrate 101 having a (110) crystal face as the front surface (first principal plane) and the reverse surface (second principal plane).

Then, as shown in FIGS. 1E to 1H, a thin film 102 is formed, for example, by a CVD (chemical vapor deposition) method, on the front surface and the reverse surface of the silicon substrate 101. The thin film 102 is formed of a material that is not easily etched by an alkaline etchant with which the silicon substrate 101 is anisotropically etched. The thin film 102 may comprise, for example, but not limited to a silicon oxide film, a silicon nitride film, or the like. The thickness of the thin film 102 is, for example, about 50 to 500 nm.

Then, an opening pattern for controlling the sacrificial layer shape is formed in the thin film 102 on the front surface of the silicon substrate 101 using a photolithography method and an etching method. The opening pattern has a substantially rhombic shape that is smaller than that of the silicon substrate 101, wherein in the preferred embodiment the first interior angle of the rhombic shape is in a range of 70.6±1 degrees and the second interior angle thereof is in a range of 109.4±1 degrees. However, in the case where a slight degradation in performance is allowed, it is possible to increase the first interior angle up to 70.6±5 degrees, and to increase the second interior angle up to 109.4±5 degrees. It is also noted that the longer diagonal of the rhombic shape is substantially parallel to the <001> orientation on the front surface of the silicon substrate 101 being the (110) crystal face. In the present embodiment, the eventual size of the diaphragm (vibrating film) is dictated by the size of the rhombic opening pattern.

Then, as shown in FIGS. 1I to 1L, a sacrificial silicon layer 103 is formed on the front surface and the reverse surface of the silicon substrate 101. The material of the sacrificial silicon layer 103 may be, but not limited to, polysilicon, amorphous silicon, or the like, which are isotropically etched by an alkaline etchant. The sacrificial silicon layer 103 on the front surface of the silicon substrate 101 is formed only within the opening of the thin film 102. Specifically, a polysilicon film or an amorphous silicon film is deposited as the sacrificial silicon layer 103 by, for example, but not limited to, a CVD method, on the front surface of the silicon substrate 101 on which the thin film 102 having a substantially rhombic opening has been formed, and then a photolithography method and a dry etching method are used so as to leave the sacrificial silicon layer 103 selectively within the opening of the thin film 102, thus forming the sacrificial silicon layer 103 only within the opening of the thin film 102 on the front surface of the silicon substrate 101.

Then, as shown in FIGS. 1M to 1P, an interlayer film 104 is formed by, for example, but not limited to, a CVD method, on the front surface and the reverse surface of the silicon substrate 101. The interlayer film 104 is a film of a material that is not easily etched by an alkaline etchant, such as, for example, a silicon oxide film, a silicon nitride film, or the like.

Then, as shown in FIGS. 2A to 2D, a diaphragm film (vibrating film) 105 is formed on the interlayer film 104 on the front surface and the reverse surface of the silicon substrate 101. On the front surface of the silicon substrate 101, a photolithography method and an etching method are used to form the diaphragm film 105 into a rhombic shape that is smaller than the silicon substrate 101 and larger than the opening pattern of the thin film 102 (i.e., the sacrificial silicon layer 103 on the front surface of the silicon substrate 101). In the present embodiment, in order for the diaphragm film 105 to function as a vibrating electrode, the diaphragm film 105 is formed by a single-layer film of a conductive material, e.g., a polysilicon film or a metal film such as an aluminum film, or a multi-layer film of a conductive film and an insulative film.

Then, as shown in FIGS. 2E to 2H, a protection film 106 is formed by, for example, but not limited to, a CVD method, entirely across the front surface and the reverse surface of the silicon substrate 101. The protection film 106 is a film of a material that is not easily etched by an alkaline etchant, e.g., a silicon oxide film, a silicon nitride film, or the like.

Then, as shown in FIGS. 2I to 2L, the various thin films deposited on the reverse surface of the silicon substrate 101 are removed so as to expose the reverse surface of the silicon substrate 101. Specifically, the multi-layer film including the various thin films deposited on the reverse surface of the silicon substrate 101 is removed by wet-etching the multi-layer film one layer at a time using a different etchant each time, such as, hydrogen fluoride or phosphoric acid depending on the film material being etched, while protecting the front surface side of the silicon substrate 101 with a resist or a silicon oxide film. Alternatively, the multi-layer film on the reverse surface of the silicon substrate 101 may be polished away all at once using a back grinder.

Then, as shown in FIGS. 2M to 2P, a thin mask film 107 is formed on the front surface and the reverse surface of the silicon substrate 101. The thin mask film 107 is a film of a material that is not easily etched by an alkaline etchant with which the silicon substrate 101 is anisotropically etched, e.g., a silicon oxide film, a silicon nitride film, or the like. Then, on the reverse surface of the silicon substrate 101, a photolithography method and an etching method are used so as to form a substantially rhombic opening in the thin mask film 107 to thereby provide an exposed surface in the bottom surface (reverse surface) of the silicon substrate 101, from where etching can be started.

FIG. 5 is a perspective view showing an opening pattern for controlling the sacrificial layer shape formed in the thin film 102 on the front surface of the silicon substrate 101 in the step shown in FIGS. 1E to 1H, in comparison with an opening pattern formed in the thin mask film 107 on the reverse surface of the silicon substrate 101 in the step shown in FIGS. 2M to 2P. As shown in FIG. 5, in the present embodiment, a substantially rhombic opening pattern, which has substantially the same sizes as the opening pattern for controlling the sacrificial layer shape formed in the thin film 102 on the substrate front surface, is formed at substantially the same plan position (XY position) in the thin mask film 107 on the substrate reverse surface. In view of the expansion and the variation from the opening pattern in the process of etching the silicon substrate 101 to be described later, an opening pattern of a substantially rhombic shape that is similar to and smaller than that of the opening pattern for controlling the sacrificial layer shape formed in the thin film 102 on the substrate front surface may be formed at substantially the same plan position (XY position) in the thin mask film 107 on the substrate reverse surface.

Then, as shown in FIGS. 3A to 3D, the portion of the reverse surface of the silicon substrate 101 being exposed through the opening pattern of the thin mask film 107 is etched with an alkaline etchant, for example, but not limited to, KOH (potassium hydroxide) or TMAH (tetramethylammonium hydroxide), thereby forming a through hole 110 in the silicon substrate 101. Since the etching rate on a crystal face equivalent to the Si (110) crystal face is several tens of times greater than that on a crystal face equivalent to the Si (111) crystal face, the etching proceeds while exposing the crystal face equivalent to the Si (111) crystal face on the inner wall of the through hole 110. As a result, on the cross section shown in FIG. 3B (in other words, on the cross section along the longer diagonal of the opening pattern, i.e., the rhombic pattern, of the thin mask film 107), there is formed an inclined plane 108 being a crystal face equivalent to the Si (111) crystal face having an angle of 35.3 degrees with respect to the front surface of the silicon substrate 101 (the Si (110) crystal face). On the cross section shown in FIG. 3D (in other words, on the cross section along the shorter diagonal of the opening pattern, i.e., the rhombic pattern, of the thin mask film 107), there is formed a vertical plane 109 being a crystal face equivalent to the Si (111) crystal face vertical to the front surface of the silicon substrate 101 (the Si (110) crystal face). When the through hole 110 runs completely through the silicon substrate 101 as the etching proceeds, the portion of the sacrificial silicon layer 103 is exposed in a slit pattern along the shorter diagonal described above in the through hole 110 as shown in FIG. 3C.

Then, when the through hole 110 runs completely through the silicon substrate 101 as described above, the etchant reaches the sacrificial silicon layer 103 on the substrate front surface through the through hole 110 as shown in FIGS. 3E to 3H. Thus, the sacrificial silicon layer 103 is isotropically etched more quickly than single-crystal Si so as to be completely removed.

Then, when the sacrificial silicon layer 103 is completely removed by etching as described above, the silicon substrate 101 starts to be etched also from the front surface thereof, whereby the through hole 110 gradually expands from the substrate front surface as shown in FIGS. 3I to 3L.

When the etching of the silicon substrate 101 further proceeds, the vertical plane 109 being a crystal face equivalent to the Si (111) crystal face is eventually formed as the inner wall of the through hole 110 along the four sides of the opening pattern, i.e., the rhombic pattern in the thin mask film 107 on the substrate reverse surface as shown in FIGS. 4A to 4D. In other words, the substantially rhombic shape of the opening in the thin film 102, in which the sacrificial silicon layer 103 was present, becomes the planar shape of the through hole 110 on the substrate front surface. Therefore, in the present embodiment, the planar shape of the through hole 110 on the substrate front surface is similar to that on the substrate reverse surface.

Then, as shown in FIGS. 4E to 4H, the thin film 102, the interlayer film 104, the protection film 106 and the thin mask film 107 are etched away with an etchant such as, for example, hydrogen fluoride, to thereby expose the diaphragm film 105. In this process, the thin film 102 and the interlayer film 104 are partially left as a diaphragm holding section 111 for holding the diaphragm film 105 over the front surface of the silicon substrate 101.

The first embodiment as described above provides a diaphragm structure used in various sensors, wherein the inner wall of the through hole 110 can be formed vertical to the substrate principal plane. In other words, it is possible to prevent the through hole 110 in the silicon substrate 101 from being tapered, as in the conventional structures. Thus, it is possible to downsize the planar shape of the diaphragm structure. It is also possible to suppress the lowering of the chip strength while ensuring a sufficient volume of the through hole 110 of the silicon substrate 101. Since the through hole 110 does not include tapered portions, it is possible to eliminate the influence of the reflection of the sound wave at such tapered portions. Moreover, since the path for the sound wave coming in from the substrate reverse surface side as viewed from the diaphragm film 105 is not narrowed midway along the path, it is possible to substantially minimize the resistance (air resistance) for the sound wave (air vibration) to pass through the through hole 110. Thus, sufficient vibration is transmitted to the diaphragm film 105. Therefore, if a MEMS device of the present embodiment is used as a sonic sensor, for example, it is possible to prevent a deterioration in the acoustic performance such as lowered sensitivity.

Therefore, according to the first embodiment, it is possible to provide a diaphragm structure in which the inner wall of the through hole 110 in the silicon substrate 101 is substantially entirely the vertical plane 109 using an inexpensive wet etching method. It is therefore also possible to provide a MEMS device using such a diaphragm structure, and a method for manufacturing the same.

The positional relationship between the opening pattern of the thin film 102 on the substrate front surface and the opening pattern of the thin mask film 107 on the substrate reverse surface according to the first embodiment will now be described. The opening pattern of the thin film 102 serves to determine the size of the diaphragm (the size of a portion of the diaphragm film 105 that substantially functions as a diaphragm (a portion that overlaps the through hole 110)) after removing the sacrificial silicon layer 103 to be formed within the opening pattern. In a case where the diaphragm structure is used as a sonic sensor, the planar shape of the through hole 110 preferably coincides with the shape of the diaphragm. However, in view of the alignment precision between the pattern on the substrate front surface and the pattern on the substrate reverse surface, it is practically preferred that the opening area of the opening pattern of the thin mask film 107 on the substrate reverse surface (the pattern defining the planar shape of the through hole 110) is designed to be about 5% smaller than that of the opening pattern of the thin film 102 on the substrate front surface. Even then, the size of the through hole 110 on the substrate front surface is about the same as the size of the through hole 110 on the substrate reverse surface. Therefore, it is sufficient that the opening pattern of the thin mask film 107 on the substrate reverse surface is aligned with the opening pattern of the thin film 102 on the substrate front surface with such a positional precision that the through hole 110 is formed within the opening pattern of the thin film 102 on the substrate front surface in the through hole formation process. If there is a misalignment between the opening patterns, there will be steps on the inner wall of the through hole 110 due to the difference between the progress of etching from the substrate reverse surface side and that from the substrate front surface side. Therefore, it is necessary to determine the acceptable range of such misalignment in view of the size of the through hole 110, the required performance of the diaphragm, etc. An acceptable range of misalignment is typically on the order of 10 μm or less.

Next, the positional relationship between the crystal orientation of the silicon substrate 101 and the opening pattern of the thin mask film 107 on the substrate reverse surface according to the first embodiment will be described. In the first embodiment, it is in principle preferred that the longer diagonal of the opening pattern, i.e., the rhombic pattern of the thin mask film 107 is parallel to the <001> orientation on the reverse surface of the silicon substrate 101 (second principal plane) being the (110) crystal face. In practice, however, even if there is a slight error (a slight angle) between the longer diagonal and the <001> orientation, the angle of the inner wall surface of the through hole 110 with respect to the substrate principal plane becomes close to 90 degrees (i.e., vertical) as compared with a conventional structure disclosed in JP 2008-98524. For example, if there is an error of about ±1 degree between the longer diagonal and the <001> orientation, etching does not proceed in the direction vertical to the substrate principal plane at the start of the etching of the silicon substrate 101, as such there will be a small overhang or a gentle slope region at the substrate front surface side after the formation of the through hole 110. Nevertheless, the inner wall of the through hole 110 is substantially entirely formed by a crystal face equivalent to the (111) crystal face that is substantially vertical to the substrate principal plane.

Thus, in the present embodiment, since the through hole 110 is formed by utilizing the large etching rate difference occurring due to the crystal orientation of silicon, the inner wall surface of the obtained through hole 110 is a crystal face equivalent to the (111) crystal face substantially vertical to the principal plane of the silicon substrate 101 being the (110) crystal face. In practice, however, the ratio between the etching rate on the (110) crystal face and that on the (111) crystal face is not infinitely large. Therefore, the inner wall of the through hole 110 has an inclination of about 89 to 91 degrees with respect to the substrate principal plane. However, as compared with the angle of the inner wall of the through hole with respect to the substrate principal plane being about 35.3 degrees in a conventional structure disclosed in JP 2008-98524, the area occupied by the inclined plane occurring on the inner wall surface of the through hole 110 of the present embodiment is very small.

While the planar shape of the through hole 110 on the substrate front surface, the planar shape of the through hole 110 on the substrate reverse surface, the shape of the vibrating film 105 and the shape of the silicon substrate 101 are rhombic in the first embodiment, the rhombic shape may have a slightly rounded corner portion depending on the processing precision (i.e., such slight corner rounding can result from standard processing techniques, and the reference to a "substantially rhombic" shape as utilized herein is intended to include a rhombic structure exhibiting such corner rounding as well as a rhombic structure with no corner rounding).

While the silicon substrate 101 having a (110) crystal face as the principal plane is used in the first embodiment, it is possible to obtain similar effects to those of the present embodiment even when using a silicon substrate whose principal plane is inclined from the (110) crystal face by about ±1 degree due to an error in the silicon wafer manufacturing process.

Moreover, in the first embodiment, the shape of the silicon substrate 101, i.e., the chip shape, is a substantially rhombic shape that is similar to the shape of the diaphragm film 105. Therefore, it is possible to employ a conventional dicing technique for cutting a wafer into a large number of chips, and the present disclosure can therefore be used without developing new techniques or making investment on plant and equipment. For example, a wafer with many rhombic chips formed therein may be irradiated with a laser beam along the dicing line, after which each rhombic chip can be separated by a cleavage operation. Then, it is possible to reduce the damage to the MEMS chips as compared with blade dicing.

The first embodiment uses a film deposition apparatus of the type in which the wafer is placed in a vertical position, wherein a film is deposited in each film deposition step on the front surface and the reverse surface of the silicon substrate 101.

Alternatively, the present disclosure may use a film deposition apparatus of the type in which the wafer is placed in a horizontal position, wherein a film is deposited only on the front surface of the silicon substrate 101 in film deposition steps other than that for the thin mask film 107.

First Variation of First Embodiment

A MEMS device according to a first variation of the first embodiment of the present disclosure, more specifically a MEMS device having a diaphragm structure used in various sensors, and a method for manufacturing the same will now be described with reference to the drawings.

FIGS. 6A to 6P, 7A to 7P, 8A to 8L and 9A to 9H are exemplary illustrations each showing a step in a method for manufacturing a MEMS device of the present variation. FIGS. 6A, 6E, 6I, 6M, 7A, 7E, 7I, 7M, 8A, 8E, 8I, 9A and 9E are plan views, FIGS. 6B, 6F, 6J, 6N, 7B, 7F, 7J, 7N, 8B, 8F, 8J, 9B and 9F are cross-sectional views taken along line A-A of FIGS. 6A, 6E, 6I, 6M, 7A, 7E, 7I, 7M, 8A, 8E, 8I, 9A and 9E, respectively, FIGS. 6C, 6G, 6K, 6O, 7C, 7G, 7K, 7O, 8C, 8G, 8K, 9C and 9G are bottom views, and FIGS. 6D, 6H, 6L, 6P, 7D, 7H, 7L, 7P, 8D, 8H, 8L, 9D and 9H are cross-sectional views taken along line B-B of FIGS. 6A, 6E, 6I, 6M, 7A, 7E, 7I, 7M, 8A, 8E, 8I, 9A and 9E, respectively. In FIGS. 6A to 6P, 7A to 7P, 8A to 8L and 9A to 9H, like elements to those of the first embodiment shown in FIGS. 1A to 1P, 2A to 2P, 3A to 3L and 4A to 4H are denoted by like reference numerals and will not be further described below.

In the present variation, first, as shown in FIGS. 6A to 6D, there is provided the rhombic silicon substrate 101 having a (110) crystal face as the front surface (first principal plane) and the reverse surface (second principal plane), as in the step shown in FIGS. 1A to 1D of the first embodiment. Then, as shown in FIGS. 6E to 6H, the thin film 102 is formed on the front surface and the reverse surface of the silicon substrate 101, and then an opening pattern for controlling the sacrificial layer shape is formed in the thin film 102 on the front surface of the silicon substrate 101, as in the step shown in FIGS. 1E to 1H of the first embodiment.

Then, as shown in FIGS. 6I to 6L, the sacrificial silicon layer 103 is formed on the front surface and the reverse surface of the silicon substrate 101. The material of the sacrificial silicon layer 103 may be, for example, polysilicon, amorphous silicon, or the like, which are isotropically etched by an alkaline etchant. In the present variation, as opposed to the first embodiment, the sacrificial silicon layer 103 is formed not only within the opening of the thin film 102 but also on the thin film 102 around the opening on the front side of the silicon substrate 101. Specifically, a polysilicon film or an amorphous silicon film is deposited as the sacrificial silicon layer 103 by, for example, a CVD method, on the front surface of the silicon substrate 101 on which the thin film 102 having a substantially rhombic opening has been formed, and then the sacrificial silicon layer 103 is patterned by a photolithography method and a dry etching method into a rhombic shape that is similar to and larger than the rhombic shape of the opening of the thin film 102 so as to cover the opening. In this process, predetermined portions of the sacrificial silicon layer 103 formed on the thin film 102 are removed so as to form in advance depressed portions (depressions for forming the diaphragm holding section) 111A eventually to be the diaphragm holding section 111 (see FIGS. 9E to 9H). In the present variation, there are formed four circular-shaped depressions 111A for forming the diaphragm holding section at the corner portions of the rhombic sacrificial silicon layer 103.

Then, as shown in FIGS. 6M to 6P, the interlayer film 104 is formed on the front surface and the reverse surface of the silicon substrate 101, as in the step shown in FIGS. 1M to 1P of the first embodiment.

Then, as shown in FIGS. 7A to 7D, the diaphragm film (vibrating film) 105 is formed on the interlayer film 104 on the front surface and the reverse surface of the silicon substrate 101, as in the step shown in FIGS. 2A to 2D of the first embodiment. On the front surface of the silicon substrate 101, a photolithography method and an etching method are used to form the diaphragm film 105 into a rhombic shape that is smaller than the silicon substrate 101 and larger than the opening pattern of the thin film 102 and the sacrificial silicon layer 103. Thus, in the present variation, the diaphragm film 105 is formed so as to overlap the depressions 11A for forming the diaphragm holding section provided in the sacrificial silicon layer 103.

Then, as shown in FIGS. 7E to 7H, the protection film 106 is formed entirely across the front surface and the reverse surface of the silicon substrate 101, as in the step shown in FIGS. 2E to 2H of the first embodiment.

Then, as shown in FIGS. 7I to 7L, the various thin films deposited on the reverse surface of the silicon substrate 101 are removed so as to expose the reverse surface of the silicon substrate 101, as in the step shown in FIGS. 2I to 2L of the first embodiment.

Then, as shown in FIGS. 7M to 7P, the thin mask film 107 is formed on the front surface and the reverse surface of the silicon substrate 101, as in the step shown in FIGS. 2M to 2P of the first embodiment. Then, on the reverse surface of the silicon substrate 101, a photolithography method and an etching method are used so as to form a substantially rhombic opening in the thin mask film 107.

Then, as shown in FIGS. 8A to 8D, the portion of the reverse surface of the silicon substrate 101 being exposed through the opening pattern of the thin mask film 107 is etched with an alkaline etchant such as, for example, KOH or TMAH, thereby forming a through hole 110 in the silicon substrate 101, as in the step shown in FIGS. 3A to 3D of the first embodiment. Since the etching rate on a crystal face equivalent to the Si (110) crystal face is several tens of times greater than that on a crystal face equivalent to the Si (111) crystal face, the etching proceeds while exposing the crystal face equivalent to the Si (111) crystal face on the inner wall of the through hole 110. As a result, on the cross section shown in FIG. 8B (in other words, on the cross section along the longer diagonal of the opening pattern, i.e., the rhombic pattern, of the thin mask film 107), there is formed the inclined plane 108 being a crystal face equivalent to the Si (111) crystal face having an angle of 35.3 degrees with respect to the front surface of the silicon substrate 101 (the Si (110) crystal face). On the cross section shown in FIG. 8D (in other words, on the cross section along the shorter diagonal of the opening pattern, i.e., the rhombic pattern, of the thin mask film 107), there is formed the vertical plane 109 being a crystal face equivalent to the Si (111) crystal face vertical to the front surface of the silicon substrate 101 (the Si (110) crystal face). When the through hole 110 runs completely through the silicon substrate 101 as the etching proceeds, the portion of the sacrificial silicon layer 103 is exposed in a slit pattern along the shorter diagonal described above in the through hole 110 as shown in FIG. 8C.

Then, when the through hole 110 runs completely through the silicon substrate 101 as described above, the etchant reaches the sacrificial silicon layer 103 on the substrate front surface through the through hole 110 as shown in FIGS. 8E to 8H, as in the step shown in FIGS. 3E to 3H of the first embodiment. Thus, the sacrificial silicon layer 103 is isotropically etched more quickly than single-crystal Si so as to be completely removed.

Then, when the sacrificial silicon layer 103 is completely removed by etching as described above, the silicon substrate 101 starts to be etched also from the front surface side thereof, whereby the through hole 110 gradually expands from the substrate front surface side as shown in FIGS. 8I to 8L, as in the step shown in FIGS. 3I to 3L of the first embodiment.

When the etching of the silicon substrate 101 further proceeds, the vertical plane 109 being a crystal face equivalent to the Si (111) crystal face is eventually formed as the inner wall of the through hole 110 along the four sides of the opening pattern, i.e., the rhombic pattern in the thin mask film 107 on the substrate reverse surface as shown in FIGS. 9A to 9D, as in the step shown in FIGS. 4A to 4D of the first embodiment. In other words, the substantially rhombic shape of the opening in the thin film 102, in which the sacrificial silicon layer 103 was present, becomes the planar shape of the through hole 110 on the substrate front surface.

Then, as shown in FIGS. 9E to 9H, the thin film 102, the interlayer film 104, the protection film 106 and the thin mask film 107 are etched away with an etchant such as, for example, hydrogen fluoride, to thereby expose the diaphragm film 105, as in the step shown in FIGS. 4E to 4H of the first embodiment. In this process, etching is controlled so that the interlayer film 104 buried in the depression 111A for forming the diaphragm holding section provided in the sacrificial silicon layer 103 (including the interlayer film 104 above the depression 111A) and the thin film 102 below the depression 111A are left as the diaphragm holding section 111, thereby holding predetermined portions of the diaphragm film 105 over the front surface of the silicon substrate 101.

According to the present variation, it is possible to obtain the following effect, in addition to effects similar to those of the first embodiment. That is, by holding only specific portions of the diaphragm film 105, instead of holding the entire periphery thereof, over the front surface of the silicon substrate 101, it is possible to reduce the force of holding the diaphragm film 105. Then, the diaphragm film 105 is more easily deformed by the application of a pressure thereto, thus improving the vibrating performance of the diaphragm film 105.

Second Variation of First Embodiment

A MEMS device according to a second variation of the first embodiment of the present disclosure, more specifically a sonic sensor having a diaphragm structure, and a method for manufacturing the same will be described with reference to the drawings. Thus, the present variation is directed to a sonic sensor using a diaphragm structure according to the first embodiment (including the first variation thereof).

Figure 10A:
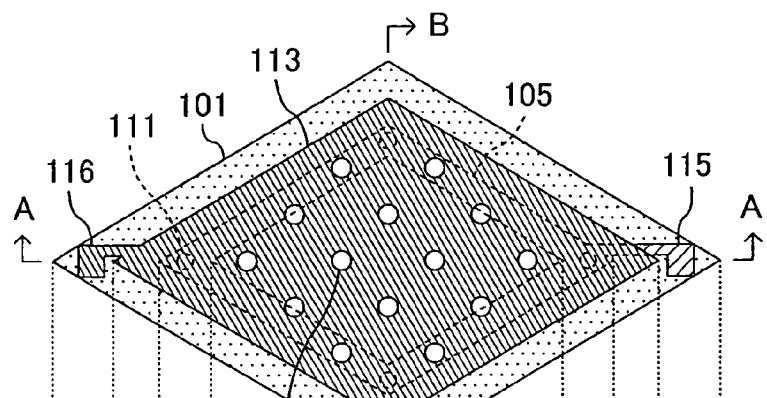
Figure 10B:
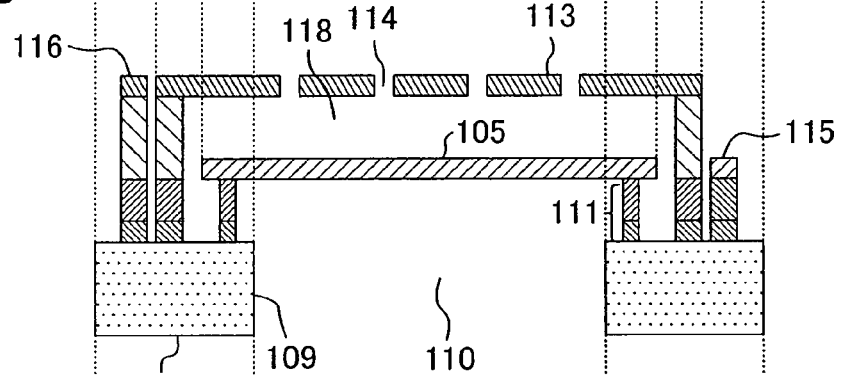
Figure 10C:
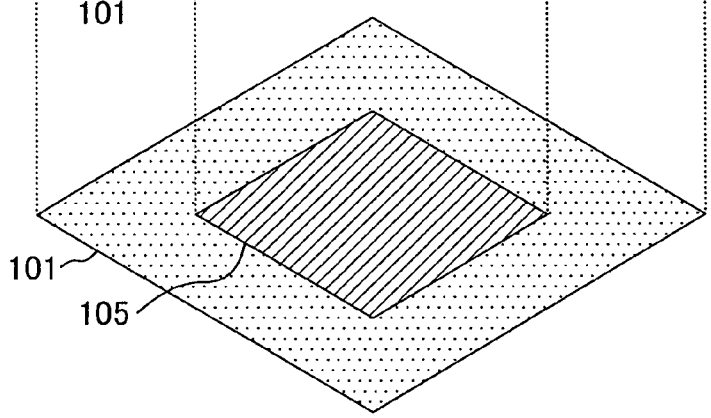
Figure 10D:
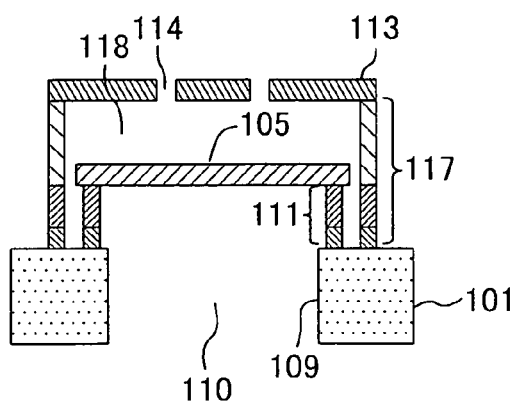
Figure 13A:
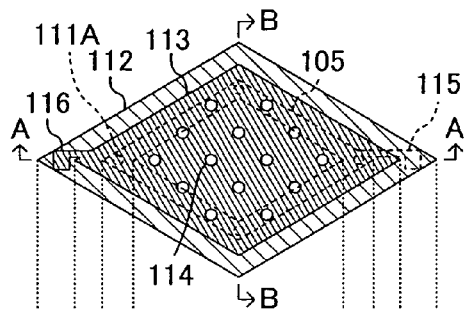
FIGS. 13A to 13H are exemplary illustrations each showing a step in the method for manufacturing a MEMS device according to the second variation of the first embodiment of the present disclosure.
Figure 13E:
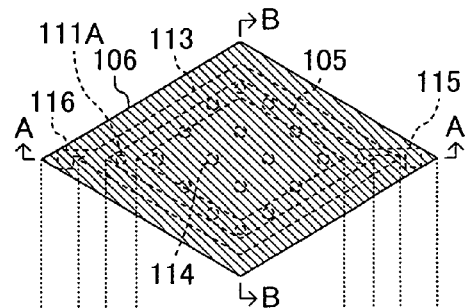
Figure 13B:
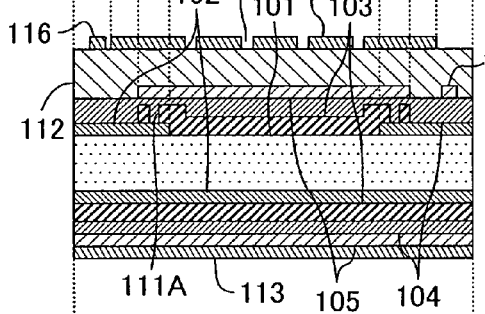
Figure 13F:
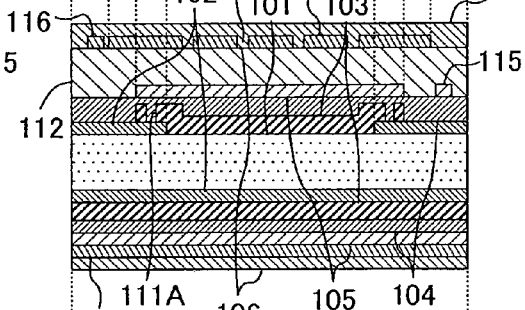
Figure 13C:
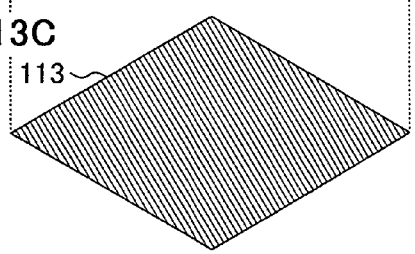
Figure 13G:
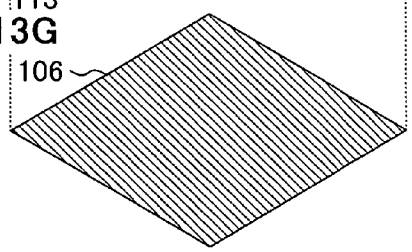
Figure 13D:
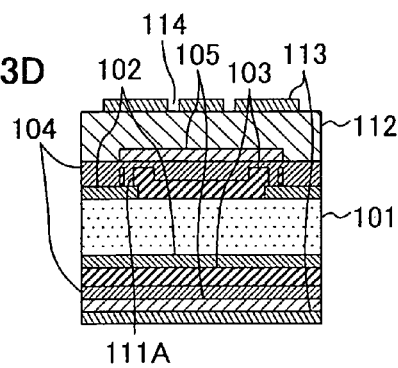
Figure 13H:
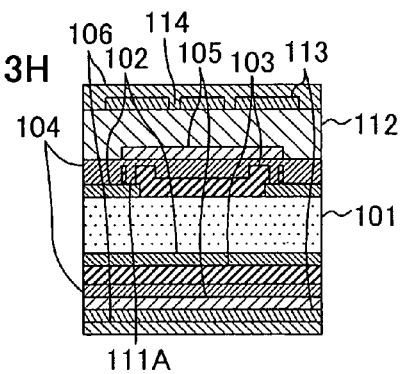
Figure 20A:
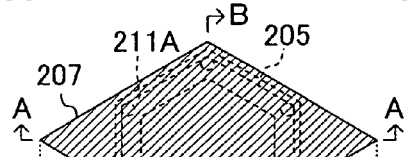
FIGS. 20A to 20H are exemplary illustrations each showing a step in the method for manufacturing a MEMS device according to the second embodiment of the present disclosure.
Figure 20E:
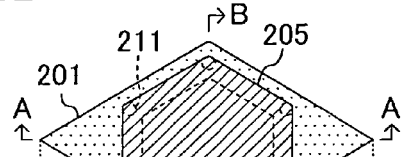
Figure 20B:
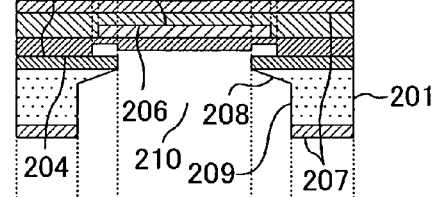
Figure 20F:
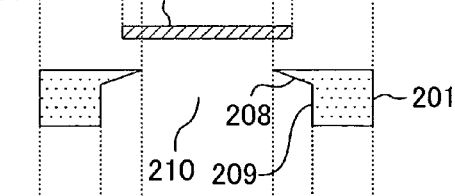
Figure 20C:
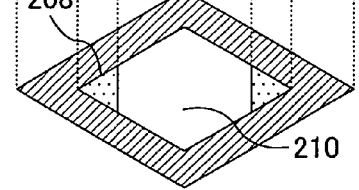
Figure 20G:
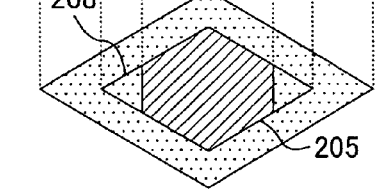
Figure 20D:
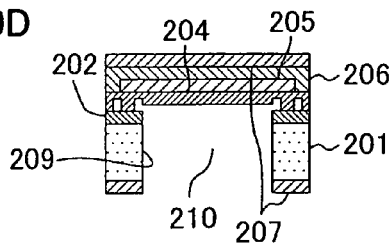
Figure 20H:
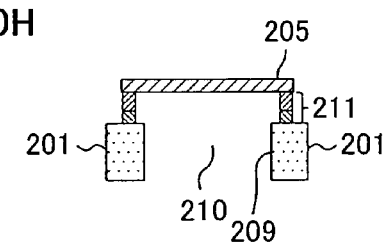

FIGS. 10A to 10D are exemplary illustrations showing a structure of the sonic sensor of the present variation. FIG. 10A is a plan view showing the sonic sensor of the present variation, FIG. 10B is a cross-sectional view taken along line A-A of FIG. 10A, FIG. 10C is a bottom view showing the sonic sensor of the present variation, and FIG. 10D is a cross-sectional view taken along line B-B of FIG. 10A. In FIGS. 10A to 10D, like elements to those of the first embodiment shown in FIGS. 1A to 1P, 2A to 2P, 3A to 3L and 4A to 4H are denoted by like reference numerals and will not be further described below.

As shown in FIGS. 10A to 10D, the sonic sensor of the present variation has a diaphragm structure of the first embodiment, i.e., a structure in which the diaphragm film (vibrating electrode film) 105 is held by the diaphragm holding section 111 over the front surface of the silicon substrate 101, and the sonic sensor further includes a fixed film (fixed electrode film) 113 formed over the vibrating electrode film 105 so as to oppose the vibrating electrode film 105, and an air gap 118 interposed between the vibrating electrode film 105 and the fixed electrode film 113. Thus, the vibrating electrode film 105 and the fixed electrode film 113 together form a condenser, thereby realizing a sonic sensor function.

The fixed electrode film 113 is held by a spacer 117 over the front surface of the silicon substrate 101. A plurality of acoustic holes 114 are formed so as to run through the fixed electrode film 113. Moreover, for the exchange of signals between the sonic sensor of the present variation and the outside, a vibrating electrode pad 115 to be electrically connected to the vibrating electrode film 105 and a fixed electrode pad 116 to be electrically connected to the fixed electrode film 113 are provided over the front surface of the silicon substrate 101 outside the area where the fixed electrode film 113 is provided.

A method for manufacturing the sonic sensor of the present variation shown in FIGS. 10A to 10D will now be described.

FIGS. 11A to 11L, 12A to 12L, 13A to 13H, 14A to 14L, 15A to 15H and 16A to 16H are exemplary illustrations each showing a step in a method for manufacturing the sonic sensor of the present variation. FIGS. 11A, 11E, 11I, 12A, 12E, 12I, 13A, 13E, 14A, 14E, 14I, 15A, 15E, 16A and 16E are plan views, FIGS. 11B, 11F, 11J, 12B, 12F, 12J, 13B, 13F, 14B, 14F, 14J, 15B, 15F, 16B and 16F are cross-sectional views taken along line A-A of FIGS. 11A, 11E, 11I, 12A, 12E, 12I, 13A, 13E, 14A, 14E, 14I, 15A, 15E, 16A and 16E, respectively, FIGS. 11C, 11G, 11K, 12C, 12G, 12K, 13C, 13G, 14C, 14G, 14K, 15C, 15G, 16C and 16G are bottom views, and FIGS. 11D, 11H, 11L, 12D, 12H, 12L, 13D, 13H, 14D, 14H, 14L, 15D, 15H, 16D and 16H are cross-sectional views taken along line B-B of FIGS. 11A, 11E, 11I, 12A, 12E, 12I, 13A, 13E, 14A, 14E, 14I, 15A, 15E, 16A and 16E, respectively. In FIGS. 11A to 11L, 12A to 12L, 13A to 13H, 14A to 14L, 15A to 15H and 16A to 16H, like elements to those of the first embodiment shown in FIGS. 1A to 1P, 2A to 2P, 3A to 3L and 4A to 4H or to those of the first variation of the first embodiment shown in FIGS. 6A to 6P, 7A to 7P, 8A to 8L and 9A to 9H are denoted by like reference numerals and will not be further described below.

In the present variation, first, as shown in FIGS. 11A to 11D, there is provided the rhombic silicon substrate 101 having a (110) crystal face as the front surface (first principal plane) and the reverse surface (second principal plane), as in the step shown in FIGS. 1A to 1D of the first embodiment. Then, as shown in FIGS. 11E to 11H, the thin film 102 is formed on the front surface and the reverse surface of the silicon substrate 101, and then a substantially rhombic opening pattern for controlling the sacrificial layer shape is formed in the thin film 102 on the front surface of the silicon substrate 101, as in the step shown in FIGS. 1E to 1H of the first embodiment.

Then, as shown in FIGS. 11I to 11L, the sacrificial silicon layer 103 is formed on the front surface and the reverse surface of the silicon substrate 101, as in the step shown in FIGS. 6I to 6L of the first variation of the first embodiment.

On the front surface of the silicon substrate 101, the sacrificial silicon layer 103 is patterned into a substantially rhombic shape that is similar to and larger than the rhombic shape of the opening of the thin film 102 so as to cover the opening, while predetermined portions of the sacrificial silicon layer 103 formed on the thin film 102 are removed so as to form in advance the depressed portions (depressions for forming the diaphragm holding section) 111A eventually to be the diaphragm holding section 111 (see FIGS. 16E to 16H).

Then, as shown in FIGS. 12A to 12D, the interlayer film 104 is formed on the front surface and the reverse surface of the silicon substrate 101, as in the step shown in FIGS. 1M to 1P of the first embodiment.

Then, as shown in FIGS. 12E to 12H, the diaphragm film (vibrating electrode film) 105 is formed on the interlayer film 104 on the front surface and the reverse surface of the silicon substrate 101, as in the step shown in FIGS. 7A to 7D of the first variation of the first embodiment. On the front surface of the silicon substrate 101, the diaphragm film 105 is formed so as to overlap the depressions 111A for forming the diaphragm holding section provided in the sacrificial silicon layer 103, and there is provided the vibrating electrode pad 115 to be electrically connected to the diaphragm film 105.

Then, as shown in FIGS. 12I to 12L, a sacrificial film 112 is formed over the front surface of the silicon substrate 101 so as to cover the diaphragm film 105. The sacrificial film 112 is eventually etched away to thereby form an air gap necessary for the condenser structure (the air gap 118 shown in FIGS. 16E to 16H). In view of this, the thickness of the sacrificial film 112 is set to a desired air gap height, e.g., 4 μm, in the present variation. Moreover, in the formation of the air gap, it is preferred that the sacrificial film 112 is etched away simultaneously with the thin film 102 and the interlayer film 104. In view of this, a silicon oxide film is used for the sacrificial film 112, as is for the thin film 102 and the interlayer film 104, in the present variation.

Then, as shown in FIGS. 13A to 13D, on the sacrificial film 112, the fixed electrode film 113 is formed so as to oppose the diaphragm film 105 while forming the fixed electrode pad 116 to be electrically connected to the fixed electrode film 113. In this process, the acoustic holes 114 are also formed so as to run through the fixed electrode film 113. In order for the fixed electrode film 113 to function as an electrode, the fixed electrode film 113 is formed by a single-layer film of a conductive material, e.g., a polysilicon film or a metal film such as an aluminum film, or a multi-layer film of a conductive film and an insulative film.

Then, as shown in FIGS. 13E to 13H, the protection film 106 is formed entirely across the front surface and the reverse surface of the silicon substrate 101, as in the step shown in FIGS. 2E to 2H of the first embodiment.

Then, as shown in FIGS. 14A to 14D, the various thin films deposited on the reverse surface of the silicon substrate 101 are removed so as to expose the reverse surface of the silicon substrate 101, as in the step shown in FIGS. 2I to 2L of the first embodiment.

Then, as shown in FIGS. 14E to 14H, the thin mask film 107 is formed on the front surface and the reverse surface of the silicon substrate 101, as in the step shown in FIGS. 2M to 2P of the first embodiment. Then, on the reverse surface of the silicon substrate 101, a photolithography method and an etching method are used so as to form a substantially rhombic opening in the thin mask film 107 to thereby provide an exposed surface on the bottom surface of the silicon substrate 101, from where etching can be started.

Then, as shown in FIGS. 14I to 14L, the portion of the reverse surface of the silicon substrate 101 being exposed through the opening pattern of the thin mask film 107 is etched with an alkaline etchant such as, for example, KOH or TMAH, thereby forming the through hole 110 in the silicon substrate 101, as in the step shown in FIGS. 3A to 3D of the first embodiment. Since the etching rate on a crystal face equivalent to the Si (110) crystal face is several tens of times greater than that on a crystal face equivalent to the Si (111) crystal face, the etching proceeds while exposing the crystal face equivalent to the Si (111) crystal face on the inner wall of the through hole 110. As a result, on the cross section shown in FIG. 14J (in other words, on the cross section along the longer diagonal of the opening pattern, i.e., the rhombic pattern, of the thin mask film 107), there is formed the inclined plane 108 being a crystal face equivalent to the Si (111) crystal face having an angle of 35.3 degrees with respect to the front surface of the silicon substrate 101 (the Si (110) crystal face). On the cross section shown in FIG. 14L (in other words, on the cross section along the shorter diagonal of the opening pattern, i.e., the rhombic pattern, of the thin mask film 107), there is formed the vertical plane 109 being a crystal face equivalent to the Si (111) crystal face vertical to the front surface of the silicon substrate 101 (the Si (110) crystal face). When the through hole 110 runs completely through the silicon substrate 101 as the etching proceeds, the portion of the sacrificial silicon layer 103 is exposed in a slit pattern along the shorter diagonal described above in the through hole 110 as shown in FIG. 14K.

Then, when the through hole 110 runs completely through the silicon substrate 101 as described above, the etchant reaches the sacrificial silicon layer 103 on the substrate front surface through the through hole 110 as shown in FIGS. 15A to 15D, as in the step shown in FIGS. 3E to 3H of the first embodiment. Thus, the sacrificial silicon layer 103 is isotropically etched more quickly than single-crystal Si so as to be completely removed.

Then, when the sacrificial silicon layer 103 is completely removed by etching as described above, the silicon substrate 101 starts to be etched also from the front surface side thereof, whereby the through hole 110 gradually expands from the substrate front surface side as shown in FIGS. 15E to 15H, as in the step shown in FIGS. 3I to 3L of the first embodiment.

When the etching of the silicon substrate 101 further proceeds, the vertical plane 109 being a crystal face equivalent to the Si (111) crystal face is eventually formed as the inner wall of the through hole 110 along the four sides of the opening pattern, i.e., the rhombic pattern in the thin mask film 107 on the substrate reverse surface as shown in FIGS. 16A to 16D, as in the step shown in FIGS. 4A to 4D of the first embodiment. In other words, the substantially rhombic shape of the opening in the thin film 102, in which the sacrificial silicon layer 103 was present, becomes the planar shape of the through hole 110 on the substrate front surface.

Then, as shown in FIGS. 16E to 16H, the thin film 102, the interlayer film 104, the sacrificial film 112, the protection film 106 and the thin mask film 107 are etched away with an etchant such as, for example, hydrogen fluoride, to thereby expose the diaphragm film (vibrating electrode film) 105 and the fixed electrode film 113, as in the step shown in FIGS. 4E to 4H of the first embodiment. Thus, there is obtained a sonic sensor of the present variation as shown in FIGS. 10A to 10D. In this process, etching is controlled so that the interlayer film 104 buried in the depression 111A for forming the diaphragm holding section provided in the sacrificial silicon layer 103 (including the interlayer film 104 above the depression 111A) and the thin film 102 below the depression 111A are left as the diaphragm holding section 111, thereby holding predetermined portions of the diaphragm film 105 over the front surface of the silicon substrate 101. With the thin film 102, the interlayer film 104 and the sacrificial film 112 being each partially left as the spacer 117, the fixed electrode film 113 is held over the front surface of the silicon substrate 101. The vibrating electrode pad 115 to be electrically connected to the vibrating electrode film 105 is held over the front surface of the silicon substrate 101 by the layered structure of the thin film 102 and the interlayer film 104, as is the vibrating electrode film 105. The fixed electrode pad 116 to be electrically connected to the fixed electrode film 113 is held over the front surface of the silicon substrate 101 by the layered structure of the thin film 102, the interlayer film 104 and the sacrificial film 112, as is the fixed electrode film 113.

According to the second variation of the first embodiment as described above, the inner wall of the through hole 110 of the silicon substrate 101 can be formed vertical to the substrate principal plane. In other words, it is possible to prevent the through hole 110 in the silicon substrate 101 from being tapered, as in a conventional structure disclosed in, for example, JP 2008-98524. Thus, it is possible to downsize the planar shape of the diaphragm structure. It is also possible to suppress the lowering of the chip strength while ensuring a sufficient volume of the through hole 110 of the silicon substrate 101. Since the through hole 110 includes no tapered portions, it is possible to eliminate the influence of the reflection of the sound wave at such tapered portions. Moreover, since the path for the sound wave coming in from the substrate reverse surface side as viewed from the diaphragm film 105 is not narrowed midway along the path, it is possible to minimize the resistance (air resistance) for the sound wave (air vibration) to pass through the through hole 110. Thus, sufficient vibration is transmitted to the diaphragm film (vibrating electrode film) 105. Therefore, with a sonic sensor of the present variation, it is possible to prevent a deterioration in the acoustic performance such as lowered sensitivity.

Therefore, according to the present variation, it is possible to provide a sonic sensor in which the inner wall of the through hole 110 in the silicon substrate 101 is substantially entirely the vertical plane 109 using an inexpensive wet etching method, and a method for manufacturing the same.

According to the present variation, by holding only specific portions of the diaphragm film 105, instead of holding the entire periphery thereof, over the front surface of the silicon substrate 101, it is possible to reduce the force of holding the diaphragm film 105. Then, the diaphragm film 105 is more easily deformed by the application of a pressure thereto, thus improving the vibrating performance of the diaphragm film 105.

While a diaphragm structure of the first embodiment (including the first variation thereof) is applied to a sonic sensor in the present variation, similar performance-improving effects can be obtained also when it is applied to other MEMS devices, e.g., various sensors such as acceleration sensors and pressure sensors.

Second Embodiment

A MEMS device according to a second embodiment of the present disclosure, more specifically a MEMS device having a diaphragm structure used in various sensors, and a method for manufacturing the same will be described with reference to the drawings.

The second embodiment differs from the first embodiment primarily in that the diaphragm shape is hexagonal, and that a thin film pattern (opening pattern) for controlling the shape of a sacrificial layer for forming the diaphragm is also hexagonal.

FIGS. 17A to 17P, 18A to 18P, 19A to 19L and 20A to 20H are exemplary illustrations each showing a step in a method for manufacturing a MEMS device of the present embodiment. FIGS. 17A, 17E, 17I, 17M, 18A, 18E, 18I, 18M, 19A, 19E, 19I, 20A and 20E are plan views, FIGS. 17B, 17F, 17J, 17N, 18B, 18F, 18J, 18N, 19B, 19F, 19J, 20B and 20F are cross-sectional views taken along line A-A of FIGS. 17A, 17E, 17I, 17M, 18A, 18E, 18I, 18M, 19A, 19E, 19I, 20A and 20E, respectively, FIGS. 17C, 17G, 17K, 17O, 18C, 18G, 18K, 18O, 19C, 19G, 19K, 20C and 20G are bottom views, and FIGS. 17D, 17H, 17L, 17P, 18D, 18H, 18L, 18P, 19D, 19H, 19L, 20D and 20H are cross-sectional views taken along line B-B of FIGS. 17A, 17E, 17I, 17M, 18A, 18E, 18I, 18M, 19A, 19E, 19I, 20A and 20E, respectively.

First, as shown in FIGS. 17A to 17D, there is provided the rhombic silicon substrate 201 having a (110) crystal face as the front surface (first principal plane) and the reverse surface (second principal plane).

Then, as shown in FIGS. 17E to 17H, the thin film 202 is formed by a CVD method, for example, on the front surface and the reverse surface of the silicon substrate 201. The thin film 202 is a film of a material that is not easily etched by an alkaline etchant with which the silicon substrate 201 is anisotropically etched, e.g., a silicon oxide film, a silicon nitride film, or the like. The thickness of the thin film 202 is, for example, about 50 to 500 nm.

Then, an opening pattern for controlling the sacrificial layer shape is formed in the thin film 202 on the front surface of the silicon substrate 201 using a photolithography method and an etching method. The opening pattern is in a line-symmetric hexagonal shape smaller than the silicon substrate 201. In the present embodiment, the size of the hexagonal opening pattern dictates the size of the diaphragm (vibrating film) eventually formed. Specifically, two of the corner portions of the hexagonal shape that are opposing each other preferably have a first interior angle in a range of 109.4±1 degrees, and the other four of the corner portions of the hexagonal shape preferably have a second interior angle in a range of 125.3±1 degrees. However, in the case where a slight degradation in performance is allowed, it is possible to increase the first interior angle up to 109.4±5 degrees, and to increase the second interior angle up to 125.3±5 degrees. The longer diagonal of a substantially rhombic shape formed by extending four sides touching the first interior angles is substantially parallel to the <001> orientation on the front surface of the silicon substrate 101 being the (110) crystal face. In other words, each side of the hexagonal shape that is between two adjacent ones of the second interior angles is substantially vertical to the <001> orientation on the first principal plane being the (110) crystal face.

Then, as shown in FIGS. 17I to 17L, the sacrificial silicon layer 203 is formed on the front surface and the reverse surface of the silicon substrate 201. The material of the sacrificial silicon layer 203 may be, for example, polysilicon, amorphous silicon, or the like, which are isotropically etched by an alkaline etchant. Specifically, a polysilicon film or an amorphous silicon film is deposited as the sacrificial silicon layer 203 by, for example, a CVD method, on the front surface of the silicon substrate 201 on which the thin film 202 having a hexagonal opening has been formed, and then a photolithography method and a dry etching method are used to pattern the sacrificial silicon layer 203 into a hexagonal shape that is similar to and larger than the hexagonal shape of the opening of the thin film 202 so as to cover the opening. In this process, predetermined portions of the sacrificial silicon layer 203 formed on the thin film 202 are removed so as to form in advance the depressed portions (depressions for forming the diaphragm holding section) 211A eventually to be a diaphragm holding section 211 (see FIGS. 20E to 20H). In the present variation, there are formed six circular-shaped depressions 211A for forming the diaphragm holding section at the corner portions of the hexagonal sacrificial silicon layer 203.

Then, as shown in FIGS. 17M to 17P, an interlayer film 204 is formed by, for example, a CVD method, on the front surface and the reverse surface of the silicon substrate 201. The interlayer film 204 is a film of a material that is not easily etched by an alkaline etchant, e.g., a silicon oxide film, a silicon nitride film, or the like.

Then, as shown in FIGS. 18A to 18D, a diaphragm film (vibrating film) 205 is formed on the interlayer film 204 on the front surface and the reverse surface of the silicon substrate 201. On the front surface of the silicon substrate 201, a photolithography method and an etching method are used to form the diaphragm film 205 into a hexagonal shape that is smaller than the sacrificial silicon layer 203 and larger than the opening pattern of the thin film 202. In the present embodiment, the diaphragm film 205 is formed so as to overlap the depressions 211A for forming the diaphragm holding section provided in the sacrificial silicon layer 203. In the present embodiment, in order for the diaphragm film 205 to function as a vibrating electrode, the diaphragm film 205 is formed by a single-layer film of a conductive material, e.g., a polysilicon film or a metal film such as an aluminum film, or a multi-layer film of a conductive film and an insulative film.

Then, as shown in FIGS. 18E to 18H, a protection film 206 is formed by, for example, a CVD method entirely across the front surface and the reverse surface of the silicon substrate 201. The protection film 206 is a film of a material that is not easily etched by an alkaline etchant, e.g., a silicon oxide film, a silicon nitride film, or the like.

Then, as shown in FIGS. 18I to 18L, the various thin films deposited on the reverse surface of the silicon substrate 201 are removed so as to expose the reverse surface of the silicon substrate 201. Specifically, the multi-layer film including the various thin films deposited on the reverse surface of the silicon substrate 201 is removed by wet-etching the multi-layer film material one layer at a time using a different etchant each time, such as, hydrogen fluoride or phosphoric acid depending on the film material being etched, while protecting the front surface side of the silicon substrate 201 with a resist or a silicon oxide film. Alternatively, the multi-layer film on the reverse surface of the silicon substrate 201 may be polished away at once using a back grinder.

Then, as shown in FIGS. 18M to 18P, a thin mask film 207 is formed on the front surface and the reverse surface of the silicon substrate 201. The thin mask film 207 is a film of a material that is not easily etched by an alkaline etchant with which the silicon substrate 201 is anisotropically etched, e.g., a silicon oxide film, a silicon nitride film, or the like. Then, on the reverse surface of the silicon substrate 201, a photolithography method and an etching method are used so as to form a substantially rhombic opening in the thin mask film 207 to thereby provide an exposed surface on the bottom surface of the silicon substrate 201, from where etching can be started.

Figure 21:
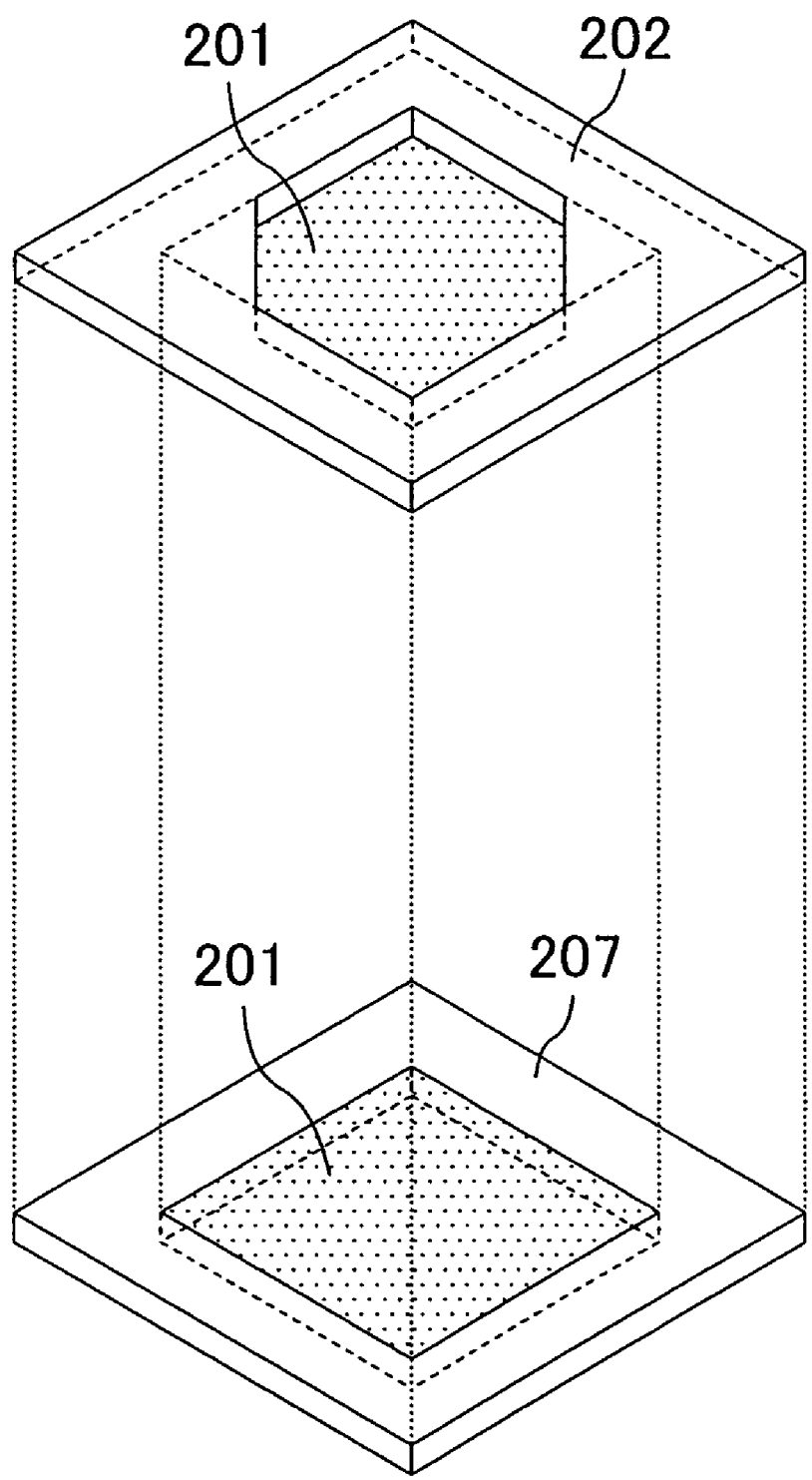
FIG. 21 is a perspective view showing an opening pattern for controlling the sacrificial layer shape formed in a thin film on the front surface of the silicon substrate in the step shown in FIGS. 17E to 17H, in comparison with an opening pattern formed in a thin mask film on the reverse surface of the silicon substrate in the step shown in FIGS. 18M to 18P.

FIG. 21 is a perspective view showing an opening pattern for controlling the sacrificial layer shape formed in the thin film 202 on the front surface of the silicon substrate 201 in the step shown in FIGS. 17E to 17H, in comparison with an opening pattern formed in the thin mask film 207 on the reverse side of the silicon substrate 201 in the step shown in FIGS. 18M to 18P. As shown in FIG. 2I, in the present embodiment, an opening pattern is formed in the thin mask film 207 on the substrate reverse surface at substantially the same plan position (XY position) as the opening pattern for controlling the sacrificial layer shape formed in the thin film 202 on the substrate front surface. As shown in FIG. 2I, the shorter diagonal of the rhombic shape of the opening pattern formed in the thin mask film 207 has substantially the same size as that of the diagonal between two first interior angles (109.4±1 degrees) of the hexagonal shape of the opening pattern formed in the thin film 202. In view of the expansion and the variation from the opening pattern in the process of etching the silicon substrate 201 to be described later, the diagonal between two first interior angles of the hexagonal shape of the opening pattern formed in the thin film 202 may be larger than the shorter diagonal of the rhombic shape of the opening pattern formed in the thin mask film 207.

Then, as shown in FIGS. 19A to 19D, the portion of the reverse surface of the silicon substrate 201 being exposed through the opening pattern of the thin mask film 207 is etched with an alkaline etchant such as, for example, KOH or TMAH, thereby forming a through hole 210 in the silicon substrate 201. Since the etching rate on a crystal face equivalent to the Si (110) crystal face is several tens of times greater than that on a crystal face equivalent to the Si (111) crystal face, the etching proceeds while exposing the crystal face equivalent to the Si (111) crystal face on the inner wall of the through hole 110. As a result, on the cross section shown in FIG. 19B (in other words, on the cross section along the longer diagonal of the opening pattern, i.e., the rhombic pattern, of the thin mask film 207), there is formed an inclined plane 208 being a crystal face equivalent to the Si (111) crystal face having an angle of 35.3 degrees with respect to the front surface of the silicon substrate 201 (the Si (110) crystal face). On the cross section shown in FIG. 19D (in other words, on the cross section along the shorter diagonal of the opening pattern, i.e., the rhombic pattern, of the thin mask film 207), there is formed a vertical plane 209 being a crystal face equivalent to the Si (111) crystal face vertical to the front surface of the silicon substrate 201 (the Si (110) crystal face). When the through hole 210 runs completely through the silicon substrate 201 as the etching proceeds, the portion of the sacrificial silicon layer 203 is exposed in a slit pattern along the shorter diagonal described above in the through hole 210 as shown in FIG. 19C.

Then, when the through hole 210 runs completely through the silicon substrate 201 as described above, the etchant reaches the sacrificial silicon layer 203 on the substrate front surface through the through hole 210 as shown in FIGS. 19E to 19H. Thus, the sacrificial silicon layer 203 is isotropically etched more quickly than single-crystal Si so as to be completely removed.

Then, when the sacrificial silicon layer 203 is completely removed by etching as described above, the silicon substrate 201 starts to be etched also from the front surface side thereof, whereby the through hole 210 gradually expands from the substrate front surface side as shown in FIGS. 19I to 19L.

When the etching of the silicon substrate 201 further proceeds, the vertical plane 209 being a crystal face equivalent to the Si (111) crystal face is eventually formed as the inner wall of the through hole 210 along the four sides of the opening pattern, i.e., the rhombic pattern in the thin mask film 207 on the substrate reverse surface as shown in FIGS. 20A to 20D. In other words, the substantially rhombic shape of the opening in the thin mask film 207 on the substrate reverse surface becomes the planar shape of the through hole 210 on the substrate reverse surface. The inclined plane 208 remains in an upper portion of the inner wall of the through hole 210 due to the hexagonal shape of the opening in the thin film 202, in which the sacrificial silicon layer 203 was present. Specifically, the inner wall surface of the through hole 210 is formed by the vertical plane 209 and the inclined plane 208, and the hexagonal shape of the opening in the thin film 202, in which the sacrificial silicon layer 203 was present, becomes the planar shape of the through hole 210 on the substrate front surface. In the present embodiment, the size of the through hole 210 on the substrate front surface is smaller than that of the through hole 210 on the substrate reverse surface.

Then, as shown in FIGS. 20E to 20H, the thin film 202, the interlayer film 204, the protection film 206 and the thin mask film 207 are etched away with an etchant such as, for example, hydrogen fluoride, to thereby expose the diaphragm film 205. In this process, etching is controlled so that the interlayer film 204 buried in the depression 211A for forming the diaphragm holding section provided in the sacrificial silicon layer 203 (including the interlayer film 204 above the depression 211A) and the thin film 202 below the depression 211A are left as the diaphragm holding section 211, thereby holding predetermined portions of the diaphragm film 205 over the front surface of the silicon substrate 201.

According to the second embodiment as described above, in a diaphragm structure used in various sensors, the inner wall of the through hole 210 (specifically, four inner wall surfaces) can be formed vertical to the substrate principal plane. In other words, it is possible to prevent the through hole 210 in the silicon substrate 201 (particularly the substrate reverse surface side) from being tapered, as in a conventional structure disclosed in JP 2008-98524. Thus, it is possible to downsize the planar shape of the diaphragm structure. It is also possible to suppress the lowering of the chip strength while ensuring a sufficient volume of the through hole 210 of the silicon substrate 201. Since the tapered portions of the through hole 210 can be reduced, it is possible to suppress the influence of the reflection of the sound wave at such tapered portions. Moreover, since the path for the sound wave coming in from the substrate reverse surface side as viewed from the diaphragm film 205 is not narrowed midway along the path, it is possible to minimize the resistance (air resistance) for the sound wave (air vibration) to pass through the through hole 110. Thus, sufficient vibration is transmitted to the diaphragm film 205. Therefore, if a MEMS device of the present embodiment is used as a sonic sensor, for example, it is possible to prevent a deterioration in the acoustic performance such as lowered sensitivity.

Therefore, according to the second embodiment, it is possible to provide a diaphragm structure in which the inner wall of the through hole 210 in the silicon substrate 201 is substantially entirely the vertical plane 209 using an inexpensive wet etching method, a MEMS device using such a diaphragm structure, and a method for manufacturing the same.

According to the second embodiment, the inclined plane 208 is left in an upper portion of the inner wall of the through hole 210, thereby providing a diaphragm structure in which the shape of the through hole 210 is hexagonal on the substrate front surface. Thus, it is possible to make the diaphragm film 205 into a hexagonal shape, of which the interior angle exceeds 90 degrees. Therefore, it is possible to suppress the stress localization at a diaphragm corner portion, thereby preventing the diaphragm film 205 being broken from the corner portion. Thus, it is possible to realize a diaphragm structure with longer lifetime and better performance, and a MEMS device such as a sonic sensor using the same.

Moreover, according to the second embodiment, by holding only specific portions of the diaphragm film 205, instead of holding the entire periphery thereof, over the front surface of the silicon substrate 201, it is possible to reduce the force of holding the diaphragm film 205. Then, the diaphragm film 205 is more easily deformed by the application of a pressure thereto, thus improving the vibrating performance of the diaphragm film 205.

The positional relationship between the crystal orientation of the silicon substrate 201 and the opening pattern of the thin mask film 207 on the substrate reverse surface according to the second embodiment will now be described. In the second embodiment, it is in principle preferred that the longer diagonal of the opening pattern, i.e., the substantially rhombic pattern of the thin mask film 207 is parallel to the <001> orientation on the reverse surface of the silicon substrate 201 (second principal plane) being the (110) crystal face. In practice, however, even if there is a slight error (a slight angle) between the longer diagonal and the <001> orientation, the angle of the inner wall surface of the through hole 210 with respect to the substrate principal plane becomes closer to 90 degrees (vertical) as compared with a conventional structure disclosed in JP 2008-98524. For example, if there is an error of about ±1 degree between the longer diagonal and the <001> orientation, etching does not proceed in the direction vertical to the substrate principal plane at the start of the etching of the silicon substrate 201, whereby there will be a small overhang or a gentle slope region at the substrate front surface side after the formation of the through hole 210. Nevertheless, the inner wall of the through hole 210 is substantially entirely formed by a crystal face equivalent to the (111) crystal face that is substantially vertical to the substrate principal plane.

Thus, in the present embodiment, since the through hole 210 is formed by utilizing the large etching rate difference occurring due to the crystal orientation of silicon, the inner wall surface of the obtained through hole 210 is mostly a crystal face equivalent to the (111) crystal face substantially vertical to the principal plane of the silicon substrate 201 being the (110) crystal face. In practice, however, the ratio between the etching rate on the (110) crystal face and that on the (111) crystal face is not infinitely large. Therefore, the inner wall of the through hole 210 mostly has an inclination of about 89 to 91 degrees with respect to the substrate principal plane. However, as compared with the angle of the inner wall of the through hole with respect to the substrate principal plane being about 35.3 degrees in a conventional structure disclosed in, for example, JP 2008-98524, the area occupied by the inclined plane occurring on the inner wall surface of the through hole 210 of the present embodiment is very small.

While the planar shape of the through hole 210 on the substrate reverse surface and the shape of the silicon substrate 201 are rhombic in the second embodiment, the rhombic shape may have a slightly rounded corner portion depending on the processing precision (i.e., the shape may be substantially rhombic, it is noted that the terms rhombic and substantially rhombic as utilized herein are intended to have the same meaning and are utilized interchangeable). Moreover, while the planar shape of the through hole 210 on the substrate front surface and the shape of the vibrating film 205 are hexagonal in the second embodiment, the hexagonal shape may have a slightly rounded corner portion depending on the processing precision (i.e., the shape may be substantially hexagonal, it is noted that the terms hexagonal and substantially hexagonal as utilized herein are intended to have the same meaning and are utilized interchangeable).

While the silicon substrate 201 having a (110) crystal face as the principal plane is used in the second embodiment, it is possible to obtain similar effects to those of the present embodiment even when using a silicon substrate whose principal plane is inclined from the (110) crystal face by about ±1 degree due to an error in the silicon wafer manufacturing process.

Moreover, in the second embodiment, the shape of the silicon substrate 201, i.e., the chip shape, is a rhombic shape. Therefore, it is possible to employ a conventional dicing technique for cutting a wafer into a large number of chips, and the present disclosure can therefore be used without developing new techniques or making investment on plant and equipment. For example, a wafer with many rhombic chips formed therein may be irradiated with a laser beam along the dicing line, after which each rhombic chip can be separated by a cleavage operation. Then, it is possible to reduce the damage to the MEMS chips as compared with blade dicing.

The second embodiment uses a film deposition apparatus of the type in which the wafer is placed in a vertical position, wherein a film is deposited in each film deposition step on the front surface and the reverse surface of the silicon substrate 201. Alternatively, the present disclosure may use a film deposition apparatus of the type in which the wafer is placed in a horizontal position, wherein a film is deposited only on the front surface of the silicon substrate 201 in film deposition steps other than that for the thin mask film 207.

Variation of Second Embodiment

A MEMS device according to a variation of the second embodiment of the present disclosure, more specifically a sonic sensor having a diaphragm structure, and a method for manufacturing the same will be described with reference to the drawings. Specifically, the present variation is directed to a sonic sensor using a diaphragm structure of the second embodiment.

Figure 22A:
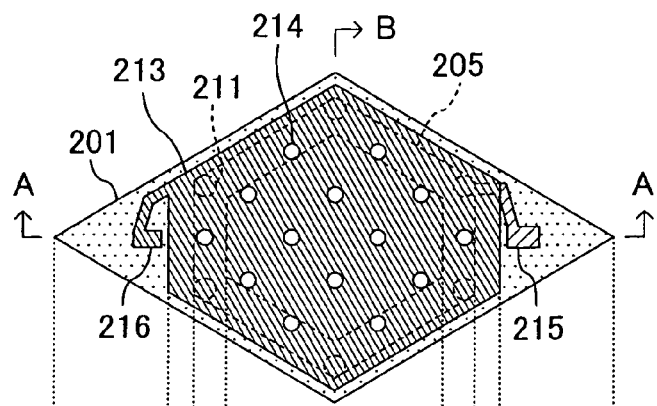
Figure 22B:
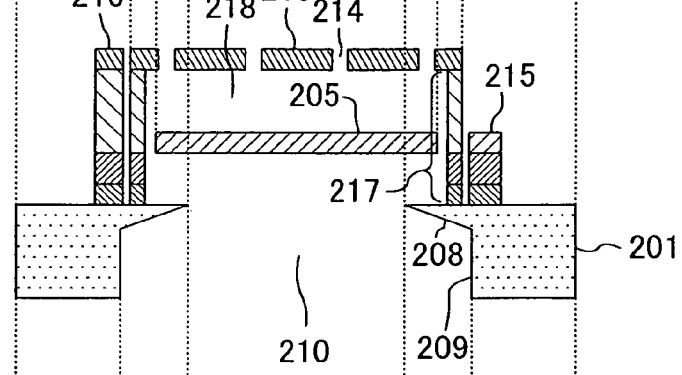
Figure 22C:
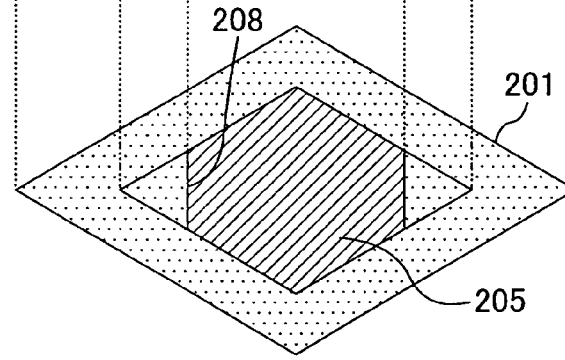
Figure 22D:
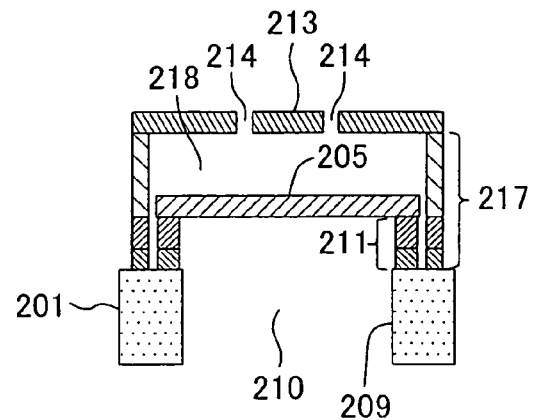
Figure 27A:
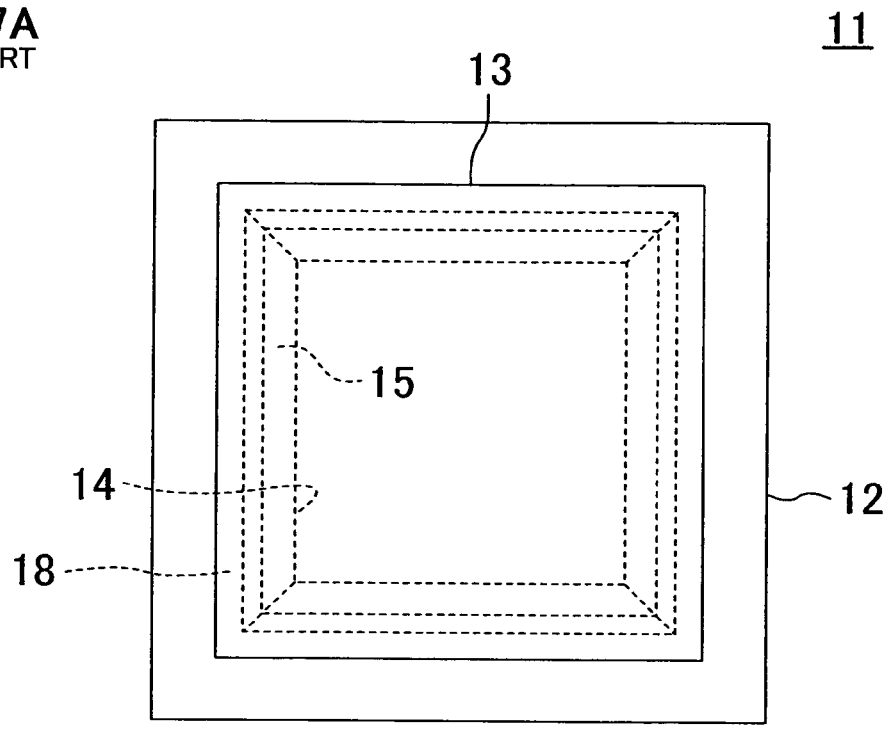
FIGS. 27A and 27B are a plan view and a cross-sectional view, respectively, showing a conventional diaphragm structure disclosed in JP 2008-98524.
Figure 27B:
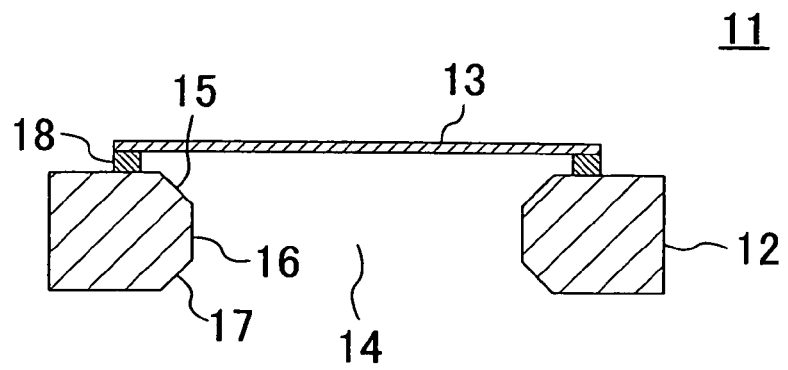
Figure 28:
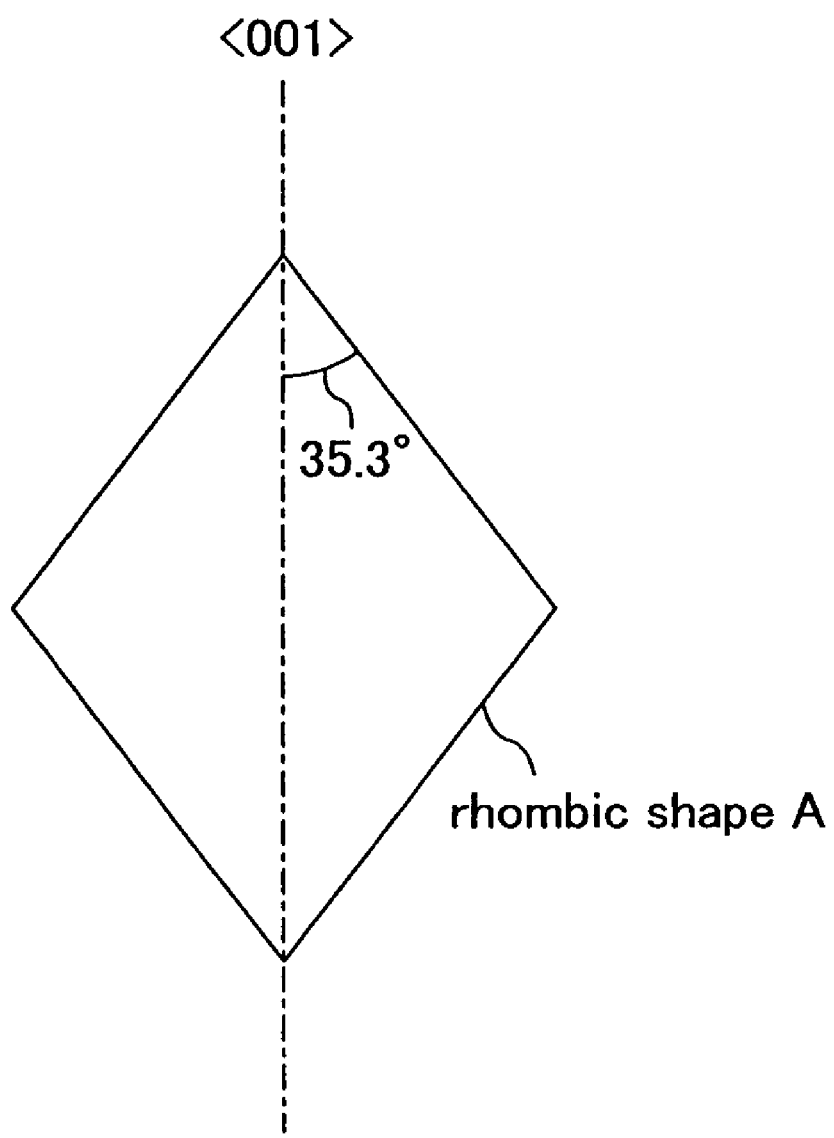
FIG. 28 is a plan view showing an opening pattern formed using a mask film on the reverse surface ((110) crystal face) of the silicon substrate in accordance with the present disclosure.

FIGS. 22A to 22D are exemplary illustrations showing a structure of the sonic sensor of the present variation. FIG. 22A is a plan view showing the sonic sensor of the present variation, FIG. 22B is a cross-sectional view taken along line A-A of FIG. 22A, FIG. 22C is a bottom view showing the sonic sensor of the present variation, and FIG. 22D is a cross-sectional view taken along line B-B of FIG. 22A. In FIGS. 22A to 22D, like elements to those of the second embodiment shown in FIGS. 17A to 17P, 18A to 18P, 19A to 19L and 20A to 20H are denoted by like reference numerals and will not be further described below.

As shown in FIGS. 22A to 22D, the sonic sensor of the present variation has a diaphragm structure of the second embodiment, i.e., a structure in which the diaphragm film (vibrating electrode film) 205 is held by the diaphragm holding section 211 over the front surface of the silicon substrate 201, and the sonic sensor further includes a fixed film (fixed electrode film) 213 formed over the vibrating electrode film 205 so as to oppose the vibrating electrode film 205, and an air gap 218 interposed between the vibrating electrode film 205 and the fixed electrode film 213. Thus, the vibrating electrode film 205 and the fixed electrode film 213 together form a condenser, thereby realizing a sonic sensor function.

The fixed electrode film 213 is held by a spacer 217 over the front surface of the silicon substrate 201. A plurality of acoustic holes 214 are formed so as to run through the fixed electrode film 213. Moreover, for the exchange of signals between the sonic sensor of the present variation and the outside, a vibrating electrode pad 215 to be electrically connected to the vibrating electrode film 205 and a fixed electrode pad 216 to be electrically connected to the fixed electrode film 213 are provided over the front surface of the silicon substrate 201 outside the area where the fixed electrode film 213 is provided.

While the inclined plane 208 being a crystal face equivalent to the Si (111) crystal face remains in an upper portion of the inner wall of the through hole 210 due to the hexagonal shape of the opening in the thin film 202 corresponding to the hexagonal shape of the diaphragm film (vibrating electrode film) 205 in the second embodiment, it is therefore possible in the present variation to provide a space above the inclined plane 208 for accommodating the vibrating electrode pad 215 and the fixed electrode pad 216. Thus, it is possible to effectively place electrode pads within a rhombic chip without increasing the chip size for accommodating the electrode pads.

A method for manufacturing the sonic sensor of the present variation shown in FIGS. 22A to 22D will now be described.

FIGS. 23A to 23P, 24A to 24P, 25A to 25P and 26A to 26L are exemplary illustrations each showing a step in a method for manufacturing a MEMS device of the present variation. FIGS. 23A, 23E, 23I, 23M, 24A, 24E, 24I, 24M, 25A, 25E, 25I, 25M, 26A, 26E and 26I are plan views, FIGS. 23B, 23F, 23J, 23N, 24B, 24F, 24J, 24N, 25B, 25F, 25J, 25N, 26B, 26F and 26J are cross-sectional views taken along line A-A of FIGS. 23A, 23E, 23I, 23M, 24A, 24E, 24I, 24M, 25A, 25E, 25I, 25M, 26A, 26E and 26I, respectively, FIGS. 23C, 23G, 23K, 23O, 24C, 24G, 24K, 24O, 25C, 25G, 25K, 25O, 26C, 26G and 26K are bottom views, and FIGS. 23D, 23H, 23L, 23P, 24D, 24H, 24L, 24P, 25D, 25H, 25L, 25P, 26D, 26H and 26L are cross-sectional views taken along line B-B of FIGS. 23A, 23E, 23I, 23M, 24A, 24E, 24I, 24M, 25A, 25E, 25I, 25M, 26A, 26E and 26I, respectively.

In the present variation, first, as shown in FIGS. 23A to 23D, there is provided the rhombic silicon substrate 101 having a (110) crystal face as the front surface (first principal plane) and the reverse surface (second principal plane), as in the step shown in FIGS. 17A to 17D of the second embodiment. Then, as shown in FIGS. 23E to 23H, the thin film 202 is formed on the front surface and the reverse surface of the silicon substrate 201, and then a substantially hexagonal opening pattern for controlling the sacrificial layer shape is formed in the thin film 202 on the front surface of the silicon substrate 201, as in the step shown in FIGS. 17E to 17H of the first embodiment.

Then, as shown in FIGS. 23I to 23L, the sacrificial silicon layer 203 is formed on the front surface and the reverse surface of the silicon substrate 201, as in the step shown in FIGS. 17I to 17L of the second embodiment. On the front surface of the silicon substrate 201, the sacrificial silicon layer 203 is patterned into a substantially hexagonal shape that is similar to and larger than the hexagonal shape of the opening of the thin film 202 so as to cover the opening, while predetermined portions of the sacrificial silicon layer 203 formed on the thin film 202 are removed so as to form in advance the depressed portions (depressions for forming the diaphragm holding section) 211A eventually to be the diaphragm holding section 211 (see FIGS. 26I to 26L).

Then, as shown in FIGS. 23M to 23P, the interlayer film 204 is formed on the front surface and the reverse surface of the silicon substrate 201, as in the step shown in FIGS. 17M to 17P of the second embodiment.

Then, as shown in FIGS. 24A to 24D, the diaphragm film (vibrating electrode film) 205 is formed on the interlayer film 204 on the front surface and the reverse surface of the silicon substrate 201, as in the step shown in FIGS. 18A to 18D of the second embodiment. On the front surface of the silicon substrate 201, the diaphragm film 205 is formed so as to overlap the depressions 211A for forming the diaphragm holding section provided in the sacrificial silicon layer 203, and there is provided the vibrating electrode pad 215 to be electrically connected to the diaphragm film 205.

Then, as shown in FIGS. 24E to 24H, a sacrificial film 212 is formed over the front surface of the silicon substrate 201 so as to cover the diaphragm film 205. The sacrificial film 212 is eventually etched away to thereby form an air gap necessary for the condenser structure (the air gap 218 shown in FIGS. 26I to 26L). In view of this, the thickness of the sacrificial film 212 is set to a desired air gap height, e.g., 4 μm, in the present variation. Moreover, in the formation of the air gap, it is preferred that the sacrificial film 212 is etched away simultaneously with the thin film 202 and the interlayer film 204. In view of this, a silicon oxide film is used for the sacrificial film 212, as is for the thin film 202 and the interlayer film 204, in the present variation.

Then, as shown in FIGS. 24I to 24L, on the sacrificial film 212, the fixed electrode film 213 is formed so as to oppose the diaphragm film 205 while forming the fixed electrode pad 216 to be electrically connected to the fixed electrode film 213. In this process, the acoustic holes 214 are also formed so as to run through the fixed electrode film 213. In order for the fixed electrode film 213 to function as an electrode, the fixed electrode film 213 is formed by a single-layer film of a conductive material, e.g., a polysilicon film or a metal film such as an aluminum film, or a multi-layer film of a conductive film and an insulative film.

Then, as shown in FIGS. 24M to 24P, the protection film 206 is formed entirely across the front surface and the reverse surface of the silicon substrate 201, as in the step shown in FIGS. 18E to 18H of the second embodiment.

Then, as shown in FIGS. 25A to 25D, the various thin films deposited on the reverse surface of the silicon substrate 201 are removed so as to expose the reverse surface of the silicon substrate 201, as in the step shown in FIGS. 18I to 18L of the second embodiment.

Then, as shown in FIGS. 25E to 25H, the thin mask film 207 is formed on the front surface and the reverse surface of the silicon substrate 201, as in the step shown in FIGS. 18M to 18P of the second embodiment. Then, on the reverse surface of the silicon substrate 201, a photolithography method and an etching method are used so as to form a substantially rhombic opening in the thin mask film 207 to thereby provide an exposed surface on the bottom surface of the silicon substrate 201, from where etching can be started.

Then, as shown in FIGS. 25I to 25L, the portion of the reverse surface of the silicon substrate 201 being exposed through the opening pattern of the thin mask film 207 is etched with an alkaline etchant such as KOH or TMAH, for example, thereby forming the through hole 210 in the silicon substrate 201, as in the step shown in FIGS. 19A to 19D of the second embodiment. Since the etching rate on a crystal face equivalent to the Si (110) crystal face is several tens of times greater than that on a crystal face equivalent to the Si (111) crystal face, the etching proceeds while exposing the crystal face equivalent to the Si (111) crystal face on the inner wall of the through hole 210. As a result, on the cross section shown in FIG. 25J (in other words, on the cross section along the longer diagonal of the opening pattern, i.e., the rhombic pattern, of the thin mask film 207), there is formed the inclined plane 208 being a crystal face equivalent to the Si (111) crystal face having an angle of 35.3 degrees with respect to the front surface of the silicon substrate 201 (the Si (110) crystal face). On the cross section shown in FIG. 25L (in other words, on the cross section along the shorter diagonal of the opening pattern, i.e., the rhombic pattern, of the thin mask film 207), there is formed the vertical plane 209 being a crystal face equivalent to the Si (111) crystal face vertical to the front surface of the silicon substrate 201 (the Si (110) crystal face). When the through hole 210 runs completely through the silicon substrate 201 as the etching proceeds, the portion of the sacrificial silicon layer 203 is exposed in a slit pattern along the shorter diagonal described above in the through hole 210 as shown in FIG. 25K.

Then, when the through hole 210 runs completely through the silicon substrate 201 as described above, the etchant reaches the sacrificial silicon layer 203 on the substrate front surface through the through hole 210 as shown in FIGS. 25M to 25P, as in the step shown in FIGS. 19E to 19H of the second embodiment. Thus, the sacrificial silicon layer 203 is isotropically etched more quickly than single-crystal Si so as to be completely removed.

Then, when the sacrificial silicon layer 203 is completely removed by etching as described above, the silicon substrate 201 starts to be etched also from the front surface side thereof, whereby the through hole 210 gradually expands from the substrate front surface side as shown in FIGS. 26A to 26D, as in the step shown in FIGS. 19I to 19L of the second embodiment.

When the etching of the silicon substrate 201 further proceeds, the vertical plane 209 being a crystal face equivalent to the Si (111) crystal face is eventually formed as the inner wall of the through hole 210 along the four sides of the opening pattern, i.e., the substantially rhombic pattern in the thin mask film 207 on the substrate reverse surface as shown in FIGS. 26E to 26H, as in the step shown in FIGS. 20A to 20D of the second embodiment. In other words, the rhombic shape of the opening in the thin mask film 207 on the substrate reverse surface becomes the planar shape of the through hole 210 on the substrate reverse surface. The inclined plane 208 remains in an upper portion of the inner wall of the through hole 210 due to the hexagonal shape of the opening in the thin film 202, in which the sacrificial silicon layer 203 was present. Specifically, the inner wall surface of the through hole 210 is formed by the vertical plane 209 and the inclined plane 208, and the hexagonal shape of the opening in the thin film 202, in which the sacrificial silicon layer 203 was present, becomes the planar shape of the through hole 210 on the substrate front surface. In the present embodiment, the size of the through hole 210 on the substrate front surface is smaller than that of the through hole 210 on the substrate reverse surface.

Then, as shown in FIGS. 26I to 26L, the thin film 202, the interlayer film 204, the sacrificial film 212, the protection film 206 and the thin mask film 207 are etched away with an etchant such as, for example, hydrogen fluoride, to thereby expose the diaphragm film (vibrating electrode film) 205 and the fixed electrode film 213, as in the step shown in FIGS. 20E to 20H of the second embodiment. Thus, there is obtained a sonic sensor of the present variation as shown in FIGS. 22A to 22D. In this process, etching is controlled so that the interlayer film 204 buried in the depression 211A for forming the diaphragm holding section provided in the sacrificial silicon layer 203 (including the interlayer film 204 above the depression 211A) and the thin film 202 below the depression 211A are left as the diaphragm holding section 211, thereby holding predetermined portions of the diaphragm film 205 over the front surface of the silicon substrate 201. With the thin film 202, the interlayer film 204 and the sacrificial film 212 being each partially left as the spacer 217, the fixed electrode film 213 is held over the front surface of the silicon substrate 201. The vibrating electrode pad 215 to be electrically connected to the vibrating electrode film 205 is held over the front surface of the silicon substrate 201 by the layered structure of the thin film 202 and the interlayer film 204, as is the vibrating electrode film 205. The fixed electrode pad 216 to be electrically connected to the fixed electrode film 213 is held over the front surface of the silicon substrate 201 by the layered structure of the thin film 202, the interlayer film 204 and the sacrificial film 212, as is the fixed electrode film 213.

According to the variation of the second embodiment as described above, the inner wall of the through hole 210 (specifically, four inner wall surfaces) of the silicon substrate 201 can be formed vertical to the substrate principal plane. In other words, it is possible to prevent the through hole 210 in the silicon substrate 201 (particularly the substrate reverse surface side) from being tapered, as in a conventional structure disclosed in, for example, JP 2008-98524. Thus, it is possible to downsize the planar shape of the diaphragm structure. It is also possible to suppress the lowering of the chip strength while ensuring a sufficient volume of the through hole 210 of the silicon substrate 201. Since the tapered portions of the through hole 210 can be reduced, it is possible to suppress the influence of the reflection of the sound wave at such tapered portions. Moreover, since the path for the sound wave coming in from the substrate reverse surface side as viewed from the diaphragm film 205 is not narrowed midway along the path, it is possible to minimize the resistance (air resistance) for the sound wave (air vibration) to pass through the through hole 210. Thus, sufficient vibration is transmitted to the diaphragm film (vibrating electrode film) 205. Therefore, with a sonic sensor of the present variation, it is possible to prevent a deterioration in the acoustic performance such as lowered sensitivity.

Therefore, according to the present variation, it is possible to provide a sonic sensor in which the inner wall of the through hole 210 in the silicon substrate 201 is substantially entirely the vertical plane 209 using an inexpensive wet etching method, and a method for manufacturing the same.

According to the present variation, the inclined plane 208 is left in an upper portion of the inner wall of the through hole 210, thereby providing a diaphragm structure in which the shape of the through hole 210 is hexagonal on the substrate front surface. Thus, it is possible to make the diaphragm film 205 into a hexagonal shape, of which the interior angle exceeds 90 degrees. Therefore, it is possible to suppress the stress localization at a diaphragm corner portion, thereby preventing the diaphragm film 205 being broken from the corner portion. Thus, it is possible to realize a diaphragm structure with longer lifetime and better performance, and a MEMS device such as a sonic sensor using the same.

Moreover, according to the present variation, by holding only specific portions of the diaphragm film 205, instead of holding the entire periphery thereof, over the front surface of the silicon substrate 201, it is possible to reduce the force of holding the diaphragm film 205. Then, the diaphragm film 205 is more easily deformed by the application of a pressure thereto, thus improving the vibrating performance of the diaphragm film 205.

While a diaphragm structure of the second embodiment is applied to a sonic sensor in the present variation, similar performance-improving effects can be obtained also when it is applied to other MEMS devices, e.g., various sensors such as acceleration sensors and pressure sensors.

Moreover, any combination of features of different embodiments described above may be employed without departing from the scope of the present disclosure. For example, the methods disclosed herein are not limited to use with MEMS devices, and may be utilized in other applications, such as, but not limited to, devices in the field of Through Silicon Via (TSV) or 3D mounting or 3D packaging.

Now, the substrate used in the present disclosure is not limited to the silicon substrate. For example, any substrate having face-centered cubic lattice may be included in the scope of the present disclosure.

Although certain specific embodiments of the present disclosure have been set forth herein, it is noted that the present disclosure may be embodied in other forms without departing from the spirit or essential characteristics thereof. The present embodiments are therefore to be considered in all respects as illustrative and not restrictive, the scope of the disclosure being indicated by the appended claims, and all changes that come within the meaning and range of equivalency of the claims are therefore intended to be embraced therein.

What is claimed is:

1. A MEMS device, comprising:
   a substrate having a first principal plane and a second principal plane opposite to the first principal plane;
   a through hole formed in the substrate; and
   a vibrating film formed over the first principal plane so as to cover the through hole, wherein:
   the first principal plane and the second principal plane are both a (110) crystal face;
   the through hole defines inner walls of the substrate, a first part of the inner walls being slanted relative to the first principal plane and a second part of the inner walls being substantially vertical relative to the second principal plane, and
   the through hole has a substantially rhombic shape on the second principal plane.

2. The MEMS device of claim 1, wherein the substrate is a silicon substrate.

3. The MEMS device of claim 1, wherein the vibrating film is partially held by a holding section.

4. The MEMS device of claim 1, wherein:
   a first interior angle of the rhombic shape is in a range of 70.6±3 degrees; and
   a second interior angle of the rhombic shape is in a range of 109.4±3 degrees.

5. The MEMS device of claim 1, wherein a longer diagonal of the rhombic shape is substantially parallel to a <001> orientation on the second principal plane being a (110) crystal face.

6. The MEMS device of claim 1, wherein a size of the through hole on the first principal plane is smaller than a size of the through hole on the second principal plane.

7. The MEMS device of claim 1, wherein the through hole has a substantially hexagonal shape on the first principal plane.

8. The MEMS device of claim 7, wherein:
   two of corner portions of the hexagonal shape that are opposing each other have a first interior angle in a range of 109.4±3 degrees; and
   the other four of the corner portions of the hexagonal shape have a second interior angle in a range of 125.3±3 degrees.

9. The MEMS device of claim 7, wherein a side extending between adjacent ones of second interior angles of the hexagonal shape is substantially vertical to a <001> orientation on the first principal plane being a (110) crystal face.

10. The MEMS device of claim 7, wherein the vibrating film has a substantially hexagonal shape.

11. The MEMS device of claim 1, wherein the substrate has a substantially rhombic shape.

12. The MEMS device of claim 1, further comprising:
   a fixed film formed over the vibrating film so as to oppose the vibrating film; and
   an air gap interposed between the vibrating film and the fixed film.

13. The MEMS device of claim 1, wherein the first part of the inner walls is located on the first principal side relative to the second part of the inner walls.

14. A method for manufacturing a MEMS device, comprising the steps of:
- (a) forming a sacrificial layer on a first principal plane of a substrate having the first principal plane and a second principal plane opposite to the first principal plane;
- (b) forming a vibrating film over the sacrificial layer;
- (c) etching the substrate from a side of the second principal plane to thereby form a through hole in the substrate; and
- (d) supplying an etchant through the through hole, thereby removing the sacrificial layer and expanding the through hole from a side of the first principal plane, wherein:
- the first principal plane and the second principal plane are both a (110) crystal face;
- the through hole defines inner walls of the substrate, a first part of the inner walls being slanted relative to the first principal plane and a second part of the inner walls being substantially vertical relative to the second principal plane, and
- the through hole has a substantially rhombic shape on the second principal plane.

15. The method for manufacturing a MEMS device of claim 14, wherein the substrate is a silicon substrate.

16. The method for manufacturing a MEMS device of claim 14, wherein the vibrating film is partially held by a holding section.

17. The method for manufacturing a MEMS device of claim 14, wherein:
- a first interior angle of the rhombic shape is in a range of 70.6±3 degrees; and
- a second interior angle of the rhombic shape is in a range of 109.4±3 degrees.

18. The method for manufacturing a MEMS device of claim 14, wherein a longer diagonal of the rhombic shape is substantially parallel to a <001> orientation on the second principal plane being a (110) crystal face.

19. The method for manufacturing a MEMS device of claim 14, wherein a size of the through hole on the first principal plane after completion of the step (d) is smaller than a size of the through hole on the second principal plane after completion of the step (d).

20. The method for manufacturing a MEMS device of claim 14, wherein the through hole has a substantially hexagonal shape on the first principal plane after completion of the step (d).

21. The method for manufacturing a MEMS device of claim 20, wherein:
- two of corner portions of the hexagonal shape that are opposing each other have a first interior angle in a range of 109.4±3 degrees; and
- the other four of the corner portions of the hexagonal shape have a second interior angle in a range of 125.3±3 degrees.

22. The method for manufacturing a MEMS device of claim 20, wherein a side extending between adjacent ones of the second interior angles of the hexagonal shape is substantially vertical to a <001> orientation on the first principal plane being a (110) crystal face.

23. The method for manufacturing a MEMS device of claim 20, wherein the vibrating film has a substantially hexagonal shape.

24. The method for manufacturing a MEMS device of claim 14, wherein the substrate has a substantially rhombic shape.

25. The method for manufacturing a MEMS device of claim 14, further comprising, after the step (b), a step (e) of forming a fixed film over the vibrating film with a sacrificial film interposed therebetween and then removing the sacrificial film to thereby form an air gap between the vibrating film and the fixed film.

26. The method of manufacturing a MEMS device of claim 14, wherein the first part of the inner walls is located on the first principal side relative to the second part of the inner walls.

27. A device, comprising:
- a substrate having a first principal plane and a second principal plane opposite to the first principal plane; and
- a through hole formed in the substrate; wherein:
- the first principal plane and the second principal plane are both a (110) crystal face;
- the through hole defines inner walls of the substrate, a first part of the inner walls being slanted relative to the first principal plane and a second part of the inner walls being substantially vertical relative to the second principal plane, and
- the through hole has a substantially rhombic shape on the second principal plane.

28. The device of claim 27, wherein the substrate is a silicon substrate.

29. The device of claim 27, wherein the first part of the inner walls is located on the first principal side relative to the second part of the inner walls.

30. A method for manufacturing a device, comprising the steps of:
- (a) forming a sacrificial layer on a first principal plane of a substrate having the first principal plane and a second principal plane opposite to the first principal plane;
- (b) etching the substrate from a side of the second principal plane to thereby form a through hole in the substrate; and
- (c) supplying an etchant through the through hole, thereby removing the sacrificial layer and expanding the through hole from a side of the first principal plane, wherein:
- the first principal plane and the second principal plane are both a (110) crystal face;
- the through hole defines inner walls of the substrate, a first part of the inner walls being slanted relative to the first principal plane and a second part of the inner walls being substantially vertical relative to the second principal plane, and
- the through hole has a substantially rhombic shape on the second principal plane.

31. The method of manufacturing a device of claim 30, wherein the substrate is a silicon substrate.

32. The method of manufacturing a device of claim 30, wherein the first part of the inner walls is located on the first principal side relative to the second part of the inner walls.

* * * * *